United States Patent
Komatsu et al.

(10) Patent No.: US 10,691,019 B2
(45) Date of Patent: Jun. 23, 2020

(54) PATTERN-FORMING METHOD AND COMPOSITION

(71) Applicant: JSR CORPORATION, Tokyo (JP)

(72) Inventors: Hiroyuki Komatsu, Tokyo (JP); Takehiko Naruoka, Tokyo (JP); Masafumi Hori, Tokyo (JP); Hitoshi Osaki, Tokyo (JP); Tomohiro Oda, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 16/376,385

(22) Filed: Apr. 5, 2019

(65) Prior Publication Data

US 2019/0235386 A1 Aug. 1, 2019

Related U.S. Application Data

(63) Continuation of application No. PCT/JP2017/036708, filed on Oct. 10, 2017.
(Continued)

(30) Foreign Application Priority Data

Oct. 7, 2016 (JP) .................................. 2016-198989

(51) Int. Cl.
*G03F 7/11* (2006.01)
*H01L 21/308* (2006.01)
(Continued)

(52) U.S. Cl.
CPC .............. *G03F 7/11* (2013.01); *C08F 112/08* (2013.01); *C08F 212/08* (2013.01);
(Continued)

(58) Field of Classification Search
None
See application file for complete search history.

(56) References Cited

U.S. PATENT DOCUMENTS

| 5,403,685 A * | 4/1995 | Vidusek | G03F 7/0035 |
| | | | 257/E21.027 |
| 9,574,104 B1 * | 2/2017 | Kim | H01L 21/0273 |

(Continued)

FOREIGN PATENT DOCUMENTS

| JP | 2002-519728 A | 7/2002 |
| JP | 2003-218383 A | 7/2003 |

(Continued)

OTHER PUBLICATIONS

International Search Report and Written Opinion dated Dec. 26, 2017 in PCT/JP2017/036708 (with English Translation), 16 pages.

*Primary Examiner* — Evren Seven
(74) *Attorney, Agent, or Firm* — Oblon, McClelland, Maier & Neustadt, L.L.P.

(57) ABSTRACT

A pattern-forming method includes forming a base pattern having recessed portions on a front face side of a substrate directly or via other layer. The recessed portions of the base pattern are filled with a first composition to form a filler layer. Phase separation of the filler layer is allowed to form a plurality of phases of the filler layer. A part of the plurality of phases of the filler layer is removed to form a miniaturized pattern. The forming of the base pattern includes: forming a resist pattern on the front face side of the substrate; forming a layer of a second polymer on lateral faces of the resist pattern; and forming a layer of a third polymer that differs from the second polymer on a surface of the substrate or on a surface of the other layer.

20 Claims, 1 Drawing Sheet

Related U.S. Application Data

(60) Provisional application No. 62/417,412, filed on Nov. 4, 2016.

(51) Int. Cl.

| | | |
|---|---|---|
| *H01L 21/027* | (2006.01) | |
| *C08F 212/08* | (2006.01) | |
| *G03F 7/20* | (2006.01) | |
| *G03F 7/32* | (2006.01) | |
| *C08F 112/08* | (2006.01) | |
| *G03F 7/16* | (2006.01) | |
| *G03F 7/00* | (2006.01) | |
| *G03F 7/039* | (2006.01) | |
| *G03F 7/40* | (2006.01) | |
| *G03F 7/075* | (2006.01) | |

(52) U.S. Cl.
CPC .......... *G03F 7/0002* (2013.01); *G03F 7/0392* (2013.01); *G03F 7/0752* (2013.01); *G03F 7/16* (2013.01); *G03F 7/20* (2013.01); *G03F 7/32* (2013.01); *G03F 7/322* (2013.01); *G03F 7/325* (2013.01); *G03F 7/405* (2013.01); *H01L 21/0274* (2013.01); *H01L 21/3086* (2013.01)

(56) References Cited

U.S. PATENT DOCUMENTS

| | | | |
|---|---|---|---|
| 2010/0297847 | A1 | 11/2010 | Cheng et al. |
| 2013/0295772 | A1* | 11/2013 | Kim ................... G03F 7/70466 438/694 |
| 2014/0378592 | A1* | 12/2014 | Trefonas ............... G03F 7/0002 524/317 |
| 2015/0225601 | A1* | 8/2015 | Komatsu .............. C09D 153/00 216/62 |
| 2015/0243514 | A1* | 8/2015 | Ruiz ................... H01L 21/3086 438/702 |
| 2015/0252216 | A1* | 9/2015 | Minegishi ............ C09D 153/00 427/265 |
| 2015/0380266 | A1* | 12/2015 | Wuister ................ G03F 7/0002 257/622 |
| 2016/0064216 | A1* | 3/2016 | Nakaoka ............... G03F 1/0046 438/700 |
| 2016/0238938 | A1* | 8/2016 | Ban ......................... G03F 7/11 |
| 2016/0293408 | A1* | 10/2016 | Komatsu ............... C08F 293/00 |
| 2017/0073542 | A1* | 3/2017 | Seino ................. B81C 1/00031 |
| 2017/0213700 | A1* | 7/2017 | Luong ............... H01J 37/32082 |
| 2017/0219922 | A1* | 8/2017 | Ku ..................... H01L 21/31055 |
| 2017/0271151 | A1* | 9/2017 | Yaguchi ................. G03F 7/168 |
| 2018/0031975 | A1* | 2/2018 | Sung ................... C09D 153/00 |

FOREIGN PATENT DOCUMENTS

| | | |
|---|---|---|
| JP | 2008-149447 A | 7/2008 |
| JP | 2016-130844 A | 7/2016 |

* cited by examiner

PATTERN-FORMING METHOD AND COMPOSITION

CROSS-REFERENCE TO RELATED APPLICATIONS

The present application is a continuation application of International Application No. PCT/JP2017/036708, filed Oct. 10, 2017, which claims priority to Japanese Patent Application No. 2016-198989, filed Oct. 7, 2016 and to U.S. Provisional Patent Application No. 62/417,412, filed Nov. 4, 2016. The contents of these applications are incorporated herein by reference in their entirety.

BACKGROUND OF THE INVENTION

Field of the Invention

The present invention relates to a pattern-forming method and a composition.

Description of the Related Art

In these days, microfabrication of various types of electronic device structures such as semiconductor devices and liquid crystal devices has been accompanied by demands for miniaturization of patterns in lithography processes. To meet such demands, methods have been proposed in which a finer pattern is formed by using a phase separation structure formed through directed self-assembly of a block copolymer produced by copolymerization of a first monomer having one property, and a second monomer having a property distinct from that of the first monomer (see, Japanese Unexamined Patent Application, Publication No. 2008-149447, Japanese Unexamined Patent Application (Translation of PCT Application), Publication No. 2002-519728, and Japanese Unexamined Patent Application, Publication No. 2003-218383).

By way of use of any one of such methods, a method has been contemplated in which after a composition containing a block copolymer is applied on a film having a formed hole pattern, a concentrically cylindrical phase separation structure is formed, followed by removing a central phase of the phase separation structure, whereby a hole pattern is formed having a hole diameter smaller than that of the hole pattern (see US Patent Application, Publication No. 2010/0297847).

SUMMARY OF THE INVENTION

According to an aspect of the present invention, a pattern-forming method includes forming a base pattern having recessed portions on a front face side of a substrate directly or via other layer. The recessed portions of the base pattern are filled with a first composition to form a filler layer. The first composition includes: a first polymer including at least two blocks; and a solvent. Phase separation of the filler layer is allowed to form a plurality of phases of the filler layer. A part of the plurality of phases of the filler layer is removed to form a miniaturized pattern. The substrate is etched by directly or indirectly using the miniaturized pattern as a mask. The forming of the base pattern includes: forming a resist pattern on the front face side of the substrate; forming a layer of a second polymer on lateral faces of the resist pattern; and forming a layer of a third polymer that differs from the second polymer on a surface of the substrate or on a surface of the other layer.

According to another aspect of the present invention, a composition includes a polymer including a functional group that bonds to at least one end of a main chain thereof, and is capable of forming a chemical bond with at least one of —COOH and —OH; a polymer including a functional group that bonds to at least one end of a main chain thereof, and is capable of forming a chemical bond with at least one of Si—H, Si—OH, Si═O and Si—NR$_2$, wherein each R independently represents a hydrogen atom or a monovalent organic group having 1 to 20 carbon atoms; and a solvent.

According to further aspect of the present invention, a pattern-forming method includes overlaying a base pattern having recessed portions on a front face side of a substrate directly or via other layer. A fifth composition is applied on lateral faces and bottom faces of the recessed portions of the base pattern to form a coating film. The coating film is heated. The recessed portions of the base pattern overlaid with the coating film are filled with a sixth composition to form a filler layer. Phase separation of the filler layer is allowed to form a plurality phases of the filler layer. A part of the plurality phases of the filler layer is removed to form a miniaturized pattern. The substrate is etched once or several times using the miniaturized pattern as a mask. The base pattern includes as a principal component a polymer including aromatic rings, a content of the aromatic rings being no less than 50% by mass with respect to the polymer. The fifth composition includes: a fourth polymer including a first structural unit; and a solvent. The sixth composition includes: a fifth polymer; and a solvent, the fifth polymer including a first block including a second structural unit, and a second block including a third structural unit that is more polar than the second structural unit. A difference in contact angles (|θ1-θ2|) is no less than 5°, wherein θ1 is a contact angle of the coating film with water on a lateral face side in the recessed portions and θ2 is a contact angle of the coating film with water on a bottom face side in the recessed portions, provided that θ1 and θ2 are measured after the heating of the coating film.

DESCRIPTION OF EMBODIMENTS

Figure 1:
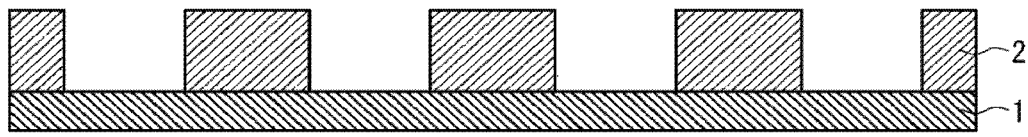
FIG. 1 is a schematic cross sectional view illustrating one example of a state after forming a resist pattern on a front face side of a substrate.

According to one embodiment of the invention, the pattern-forming method (hereinafter, may be also referred to as "pattern-forming method (A)" or "pattern-forming method (A)") includes: forming a base pattern (hereinafter, may be also referred to as "base pattern-forming step") on a front face side of a substrate directly or via other layer; filling recessed portions of the base pattern (hereinafter, may be also referred to as "filling step") with a first composition (hereinafter, may be also referred to as "composition (I)"); permitting phase separation (hereinafter, may be also referred to as "phase separation step") in a filler layer formed by the filling of the recessed portions; removing a part of phases of the filler layer (hereinafter, may be also referred to as "removing step") after the phase separation; and etching the substrate (hereinafter, may be also referred to as "etching step") by directly or indirectly using a miniaturized pattern formed by the removing. The composition (I) contains: a first polymer including at least two blocks (hereinafter, may be also referred to as "(A) polymer" or "polymer (A)"); and a solvent (hereinafter, may be also referred to as "(S) solvent" or "solvent (S)"). The forming of the base pattern includes: forming a resist pattern (hereinafter, may be also referred to as "resist pattern-forming step") on the front face side of the substrate; and forming a layer (hereinafter, may be also referred to as "(B) polymer layer" or "polymer layer (B)") of a second polymer (hereinafter, may be also referred to as "(B) polymer" or "polymer (B)") on at least lateral faces of the resist pattern, and forming a layer (hereinafter, may be also referred to as "(C) polymer layer" or "polymer layer (C)") of a third polymer (hereinafter, may be also referred to as "(C) polymer" or "polymer (C)") that differs from the polymer (B) on at least a surface of the substrate or of the other layer (hereinafter, may be also referred to as "polymer layer-forming step").

According to another embodiment of the invention, a composition contains: a polymer comprising a first functional group (hereinafter, may be also referred to as "functional group (1)") that bonds to at least one end of a main chain thereof, and is capable of forming a chemical bond with at least one of —COOH and —OH; a polymer comprising a second functional group (hereinafter, may be also referred to as "functional group (2)") that bonds to at least one end of a main chain thereof, and is capable of forming a chemical bond with at least one of Si—H, Si—OH, Si═O and Si—NR$_2$, wherein two Rs each independently represent a hydrogen atom or a monovalent organic group having 1 to 20 carbon atoms; and a solvent.

According to still another embodiment of the invention, a pattern-forming method (hereinafter, may be also referred to as "pattern-forming method (B)") includes: overlaying a base pattern (hereinafter, may be also referred to as "base pattern-overlaying step") on a front face side of a substrate directly or via other layer; applying (hereinafter, may be also referred to as "applying step") a fifth composition (hereinafter, may be also referred to as "composition (V)") on lateral faces and bottom faces of recessed portions of the base pattern; heating a coating film (hereinafter, may be also referred to as "heating step") formed by the applying of the composition (V); filling with a sixth composition (hereinafter, may be also referred to as "composition (VI)"), the recessed portions of the base pattern overlaid with the coating film; permitting phase separation (phase separation step) in a filler layer formed by the filling of the recessed portions; removing a part of phases of the filler layer (removing step) after the phase separation; and etching the substrate (etching step) once or several times using a miniaturized pattern formed by the removing, wherein the base pattern includes as a principal component a polymer comprising aromatic rings with a content of no less than 50% by mass, the composition (V) contains: a fourth polymer (hereinafter, may be also referred to as "polymer (A')") comprising a first structural unit (hereinafter, may be also referred to as "structural unit (I)"); and a solvent, the composition (VI) contains: a fifth polymer (hereinafter, may be also referred to as "polymer (B')"); and a solvent, the polymer (B') including a first block (hereinafter, may be also referred to as "block (A)") that includes a second structural unit (hereinafter, may be also referred to as "structural unit (II)"), and a second block (hereinafter, may be also referred to as "block (B)") that includes a third structural unit (hereinafter, may be also referred to as "structural unit (III)") that is more polar than the structural unit (II), and a difference in contact angles ($|\theta1-\theta2|$) is no less than 5°, wherein $\theta1$ is a contact angle of the coating film with water on a lateral face side in the recessed portions and $\theta2$ is a contact angle of the coating film with water on a bottom face side in the recessed portions, provided that $\theta1$ and $\theta2$ are measured after the heating of the coating film.

The term "chemical bond" as referred to herein means a concept involving a covalent bond, an ionic bond, a metallic bond and a coordinate bond, as well as a hydrogen bond and an electrostatic attractive force between molecules.

In brief, the pattern-forming methods (A) and (B) include: forming a base pattern on the front face side of a substrate directly or via other layer; filling recessed portions of the base pattern with the first composition containing the first polymer having at least two blocks and a solvent; permitting phase separation in the filler layer formed by the filling of the recessed portions; removing a part of phases of the filler layer after the phase separation; and etching the substrate by directly or indirectly using a miniaturized pattern formed by the removing, wherein the base pattern has: a first layer on at least lateral faces of the recessed portions; and a second layer on the front face side of at least the substrate or the other layer of the recessed portions, the second layer having a contact angle of the surface thereof that is different from the contact angle of the first layer.

The pattern-forming method and the composition of the embodiments of the present invention are capable of forming a pattern on a substrate with favorable shape and arrangement. Specifically, prominent placement errors, i.e., displacement of centers in the hole pattern, and prominent generation of residues at the bottom of the hole pattern, or inferior uniformity in pattern size represented by Critical Dimension Uniformity (CDU), etc., can be reduced. Therefore, these can be suitably used for lithography processes in manufacture of various types of electronic devices such as semiconductor devices and liquid crystal devices for which further microfabrication is demanded.

Hereinafter, embodiments of the pattern-forming method of the present invention will be described in detail with reference to FIGS. 1 to 5.

The embodiments of the present pattern-forming method include the pattern-forming method (A) and the pattern-forming method (B). The pattern-forming method (A) enables a miniaturized pattern to be formed with inhibited placement errors and with reduced residues at the bottom, even in the case of fine pattern formation. The pattern-forming method (B) enables a miniaturized pattern superior in pattern size uniformity to be formed. According to pattern-forming methods of the embodiments of the present invention, formation of a pattern on a substrate with favorable shape and arrangement is enabled by using the superior miniaturized pattern. In the following, the pattern-forming method (A) and the pattern-forming method (B) will be described.

Pattern-Forming Method (A)

The pattern-forming method (A) includes the base pattern-forming step, the filling step, the phase separation step, the removing step and the etching step. In the pattern-forming method (A), the base pattern-forming step includes the resist pattern-forming step and the polymer layer-forming step.

The pattern-forming method (A) includes each step described above, and in the base pattern-forming step, the resist pattern-forming step and the polymer layer-forming step are included, in the polymer layer-forming step. The polymer layer (B) is formed on at least lateral faces of the resist pattern, and the polymer layer (C) is formed on at least the surface of the substrate or of the other layer, whereby formation of a miniaturized pattern is enabled with inhibited placement errors and with reduced residues at the bottom even in the case of fine pattern formation. In turn, by using such a superior miniaturized pattern, formation of a pattern on a substrate with favorable shape and arrangement is enabled. Although not necessarily clarified and without wishing to be bound by any theory, the reason for achieving the effects described above by the pattern-forming method (A) due to the aforementioned constitution is inferred as in the following, for example. By including the resist pattern-forming step and the polymer layer-forming step, the polymer layer (B) is formed on the lateral faces of the resist pattern, i.e., lateral faces of the recessed portions of the base pattern whereas the polymer layer (C) is formed on the surface of the substrate or of the other layer, i.e., bottom faces of the recessed portions of the base pattern, and thus different layers from each other are formed on the lateral faces and bottom faces of the recessed portions of the base pattern. It is considered that due to the layers formed on the lateral faces and the bottom faces of the recessed portions, respectively, and thereafter more appropriate phase separation would be permitted in the filler layer of the polymer (A) formed in the recessed portions. As a result, even in the case in which a formed pattern is to be fine, the pattern can be formed with inhibited placement errors and with reduced residues at the bottom. Hereinafter, each step will be described.

Base Pattern-Forming Step

Figure 2:
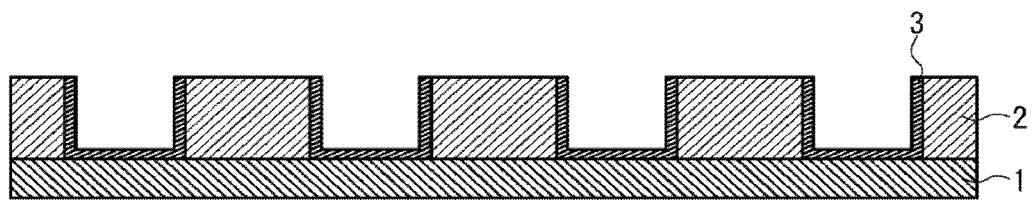
FIG. 2 is a schematic cross sectional view illustrating one example of a state after forming a polymer layer (B) and a polymer layer (C) on the lateral faces of the resist pattern and on the surface of the substrate shown in FIG. 1.
Figure 3:
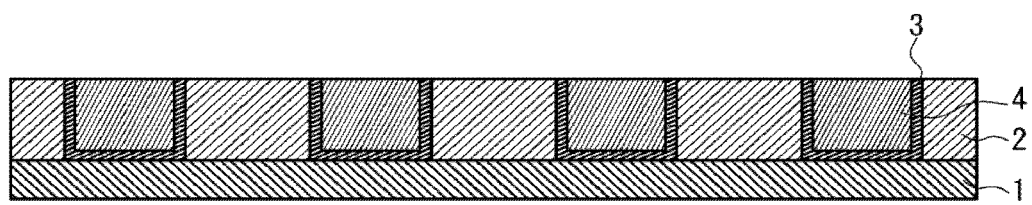
FIG. 3 is a schematic cross sectional view illustrating one example of a state after filling the recessed portions of the base pattern shown in FIG. 2 with a composition (I)

In this step, the base pattern (hereinafter, may be also referred to as "base pattern (I)") is formed on a front face side of a substrate directly or via other layer. The base pattern-forming step includes the resist pattern-forming step and the polymer layer-forming step. FIG. 1 shows a state of forming a resist pattern 2 directly on the front face side of a substrate 1. FIG. 2 shows a state of forming a polymer layer 3 on recessed portions of the resist pattern 2. Of the polymer layer 3 in FIG. 2, the polymer layer (B) is formed on lateral faces of the recessed portions of the resist pattern, whereas the polymer layer (C) is formed on bottom faces of the recessed portions. Each step will be described below.

As the substrate 1, a conventionally well-known substrate, for example, a silicon substrate such as a silicon (Bare-Si) wafer and silicon nitride, or a wafer coated with aluminum may be used. Of these, the silicon substrate is preferred, and the silicon wafer is more preferred.

The other layer is exemplified by a resist underlayer film, an SOG (Spin-On-Glass) film, and the like. The SOG film is a silicon-containing film.

A composition for forming the resist underlayer film is exemplified by a conventionally well-known organic underlayer film-forming material and the like, and examples thereof include a composition for underlayer film formation containing a crosslinking agent, and the like.

The composition for forming the SOG film which may be used is a conventionally well-known SOG composition, or the like, and examples thereof include a composition containing organic polysiloxane, and the like. Of these, the SOG composition is preferred.

The forming procedure of the SOG film is not particularly limited, and, for example, a process in which after applying an SOG composition on one face of the substrate or on the face of the underlayer film not facing the substrate 1 by a well-known procedure such as spin coating, followed by PB, the resultant coating film is hardened by carrying out irradiation with a radioactive ray and/or heating, and the like may be exemplified. Examples of the radioactive ray for use in irradiation include: electromagnetic waves such as a visible light ray, an ultraviolet ray, a far ultraviolet ray, an X-ray and a γ-ray; particle rays such as electron beam, a molecular beam and an ion beam; and the like. The lower limit of the temperature of the heating is preferably 100° C., more preferably 150° C., and still more preferably 180° C. The upper limit of the temperature of the heating is preferably 450° C., more preferably 400° C., and still more preferably 350° C. The lower limit of the time period of the heating is preferably 5 sec, more preferably 10 sec, and still more preferably 20 sec. The upper limit of the time period of the heating is preferably 1,200 sec, more preferably 600 sec, and still more preferably 300 sec. The lower limit of the average thickness of the SOG film is preferably 10 nm, more preferably 15 nm, and still more preferably 20 nm. The upper limit of the average thickness is preferably 1,000 nm, more preferably 500 nm, and still more preferably 100 nm.

The substrate and the other layer preferably include at least one of Si—H, Si—OH, Si=O and Si—NR$_2$ on the upper face of the same. Two Rs each independently represent a hydrogen atom or a monovalent organic group having 1 to 20 carbon atoms. The "organic group" as referred to herein means a group having at least one carbon atom. Examples of the monovalent organic group include alkyl groups such as a methyl group and an ethyl group, and the like. R preferably represents a hydrogen atom. The upper one of the substrate and the other layer is preferably made of SiO$_2$ or SiN. In the case of using the other layer, the other layer is preferably the silicon-containing film.

Resist Pattern-Forming Step

As shown in FIG. 1, the resist pattern 2 may be formed directly on the front face side of the substrate 1, or via other layer on the front face side of the substrate 1, for example, an underlayer film, an SOG film or the like is formed on the substrate 1, and thereafter the resist pattern 2 may be formed on the face of the other side of the provided film on the substrate 1. Of these, in light of possible formation of the pattern more conveniently on the substrate by etching using a formed resist pattern as a mask, the resist pattern 2 is preferably formed directly on the front face side of the substrate.

With respect to the procedure of formation of the resist pattern 2, for example, a method including applying of a resist composition, followed by exposure and development, or the like may be employed.

The resist composition is exemplified by conventional resist compositions such as: a resist composition containing a polymer having an acid-labile group and a radiation-sensitive acid generator; a negative-tone resist composition containing a polymer having a crosslinkable group, and a radiation-sensitive acid generator; and the like. The "acid-labile group" as referred to herein means a group that will substitute for the hydrogen atom included in —COOH, —OH, etc., the group being to be dissociated by an action of an acid. The acid-labile group that will substitute for the hydrogen atom included in —COOH is exemplified by a tertiary hydrocarbon group and the like, and examples thereof include t-alkyl groups such as a t-butyl group and a t-amyl group, 1-alkylcycloalkan-1-yl groups such as a 1-ethylcyclopentan-1-yl group, 2-alkylbicycloalkan-2-yl groups such as a 2-methyladamantan-2-yl group, and the like.

In the procedure of formation of the resist pattern 2, the resist composition is first applied on the surface of the substrate 1 or on the surface of the other layer, and thereafter prebaking (PB) is carried out, whereby a resist film is formed. Next, an exposure is carried out through a mask pattern for forming the resist pattern 2 having a desired configuration. Examples of the radioactive ray which may be used for the exposure include electromagnetic waves such as an ultraviolet ray, a far ultraviolet ray, an extreme ultraviolet ray (EUV), and an X-ray; charged particle rays such as an electron beam and an α-ray, and the like. Of these, the far ultraviolet ray is preferred, an ArF excimer laser beam and a KrF excimer laser beam are more preferred, and an ArF excimer laser beam is still more preferred. For the exposure, liquid immersion lithography may be employed. After the exposure, it is preferred that post exposure baking (PEB) is carried out. Then, a development is carried out by using a developer solution, e.g., an alkaline developer solution such as a 2.38% by mass aqueous tetramethylammonium hydroxide solution or an aqueous tetrabutylammonium hydroxide solution, an organic solvent developer solution such as butyl acetate or anisole.

The lower limit of the average thickness of the resist film is preferably 10 nm, more preferably 30 nm, and still more preferably 50 nm. The upper limit of the average thickness is preferably 1,000 nm, more preferably 500 nm, and still more preferably 200 nm.

The shape of the resist pattern 2 may be appropriately selected depending on the shape of the formed pattern that the substrate will finally have, and is exemplified by, in a planar view, circular (substantially true circular), oval, regular tetragonal, rectangular, hook shaped, trapezoidal, triangular, and the like. Of these, the shape of the formed pattern is preferably circular.

In the case of the resist pattern 2 to be formed being circular, the lower limit of the average diameter thereof is preferably 10 nm, more preferably 20 nm, still more preferably 30 nm, and particularly preferably 40 nm. The upper limit of the average diameter is preferably 200 nm, more preferably 100 nm, still more preferably 90 nm, and particularly preferably 80 nm.

The lower limit of the pitch of the resist pattern 2 to be formed is preferably 30 nm, more preferably 50 nm, still more preferably 70 nm, and particularly preferably 90 nm. The upper limit of the pitch is preferably 1,000 nm, more preferably 500 nm, still more preferably 200 nm, and particularly preferably 150 nm.

The resist pattern 2 preferably includes at least one of —COOH and —OH on the lateral face thereof.

Such a resist pattern 2 including at least one of —COOH and —OH on the lateral face thereof may be formed by, for example: applying a resist composition containing a polymer having an acid-labile group and a radiation-sensitive acid generator; exposure; and development with an organic solvent developer solution. Alternatively, the resist pattern 2 may be formed by: applying a resist composition containing a polymer having an acid-labile group and a radiation-sensitive acid generator; exposure; and development with an alkaline developer solution, followed by subjecting a resist film obtained to heating or an exposure, thereby allowing the acid-labile group in the resist film to be dissociated.

Polymer Layer-Forming Step

In this step, as shown in FIG. 2, the polymer layer (B) is formed on at least lateral faces of the resist pattern 2, and the polymer layer (C) is formed on at least the surface of the substrate or of the other layer. This step includes a step of forming the polymer layer (B) (hereinafter, may be also referred to as "polymer layer (B)-forming step") and the step of forming the polymer layer (C) (hereinafter, may be also referred to as "polymer layer (C)-forming step"), and these steps may be carried out either separately or simultaneously.

Polymer Layer (B)-Forming Step

In this step, the polymer layer (B) is formed on at least lateral faces of the resist pattern 2.

The procedure of forming the polymer layer (B) is exemplified by a method including a step (hereinafter, may be also referred to as "composition (II)-applying step") of applying a composition (II) containing the polymer (B) and a solvent (hereinafter, may be also referred to as "solvent (S)"), and the like.

Composition (II)

The composition (II) contains the polymer (B) and the solvent (S). The composition (II) may also contain other component(s) in addition to the polymer (B) and the solvent (S).

(B) Polymer

The polymer (B) preferably has the functional group (1) that bonds to at least one end of a main chain thereof, and is capable of forming a chemical bond with at least one of —COOH and —OH. The term "main chain" as referred to herein means the longest one of atom chains of a polymer.

Examples of the functional group (1) include a hydroxyl group, an epoxy group (oxiranyl group), an oxetanyl group, and the like. These functional groups form covalent bonds with —COOH and/or —OH.

The polymer (B) is exemplified by a styrene polymer, a (meth)acrylic polymer, an ethylene polymer, a copolymer of a combination thereof, and the like.

The styrene polymer has a structural unit derived from a substituted or unsubstituted styrene.

Examples of the substituted styrene include: α-methylstyrene; o-, m-, p-methylstyrene; p-t-butylstyrene; 2,4,6-trimethylstyrene; p-methoxystyrene; p-t-butoxystyrene; o-, m-, p-vinylstyrene; o-, m-, p-hydroxystyrene; m-, p-chloromethylstyrene; p-chlorostyrene; p-bromostyrene; p-iodostyrene; p-nitrostyrene; p-cyanostyrene; and the like.

The (meth)acrylic polymer has a structural unit derived from (meth)acrylic acid or a (meth)acrylic acid ester.

Examples of the (meth)acrylic acid ester include:

(meth)acrylic acid alkyl esters such as methyl (meth)acrylate, ethyl (meth)acrylate, t-butyl (meth)acrylate and 2-ethylhexyl (meth)acrylate;

(meth)acrylic acid cycloalkyl esters such as cyclopentyl (meth)acrylate, cyclohexyl (meth)acrylate, 1-methylcyclopentyl (meth)acrylate, 2-ethyladamantyl (meth)acrylate and 2-(adamantan-1-yl)propyl (meth)acrylate;

(meth)acrylic acid aryl esters such as phenyl (meth)acrylate and naphthyl (meth)acrylate;

(meth)acrylic acid substituted alkyl esters such as 2-hydroxyethyl (meth)acrylate, 3-hydroxyadamantyl (meth)acrylate, 3-glycidylpropyl (meth)acrylate and 3-trimethylsilylpropyl (meth)acrylate; and the like.

The ethylene polymer has a structural unit derived from substituted or unsubstituted ethylene.

Examples of the substituted ethylene include:

alkenes such as propene, butene and pentene;

vinylcycloalkanes such as vinylcyclopentane and vinylcyclohexane;

cycloalkenes such as cyclopentene and cyclohexene;

4-hydroxy-1-butene, vinyl glycidyl ether, vinyl trimethylsilyl ether; and the like.

The lower limit of the weight average molecular weight (Mw) of the polymer (B) is preferably 1,000, more preferably 3,000, still more preferably 5,000, and particularly preferably 5,500. The upper limit of Mw is preferably 100,000, more preferably 50,000, still more preferably 15,000, and particularly preferably 10,000.

The upper limit of the ratio (dispersity index) of the Mw to the number average molecular weight (Mn) of the polymer (B) is preferably 5, more preferably 3, even more preferably 2 and particularly preferably 1.3. The lower limit of the ratio is typically 1, and preferably 1.05.

The Mw and Mn herein are determined by gel permeation chromatography (GPC) through using GPC columns ("G2000 HXL"×2; "G3000 HXL"×1; and "G4000 HXL"×1, available from Tosoh Corporation), under analytical conditions involving: the flow rate of 1.0 mL/min; the elution solvent of tetrahydrofuran; sample concentration of 1.0% by mass; the amount of injected sample of 100 µL; and the column temperature of 40° C., with a differential refractometer as a detector, based on mono-dispersed polystyrene as a standard.

The lower limit of the content of the polymer (B) in the composition (II) with respect to the total solid content is preferably 80% by mass, more preferably 90% by mass, and still more preferably 95% by mass. The upper limit of the content is, for example, 100% by mass. The "total solid content" as referred to means the sum of the components other than the solvent (S).

(S) Solvent

The solvent (S) is not particularly limited as long as it is a solvent capable of dissolving or dispersing at least the polymer (B) and other component(s).

The solvent (S) is exemplified by an alcohol solvent, an ether solvent, a ketone solvent, an amide solvent, an ester solvent, a hydrocarbon solvent, and the like.

Examples of the alcohol solvent include:

monohydric alcohol solvents such as methanol, ethanol, n-propanol, iso-propanol, n-butanol, iso-butanol, sec-butanol, tert-butanol, n-pentanol, iso-pentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol and diacetone alcohol;

polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol and tripropylene glycol;

polyhydric alcohol partially etherated solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether and dipropylene glycol monopropyl ether; and the like.

Examples of the ether solvent include:

dialkyl ether solvents such as diethyl ether, dipropyl ether and dibutyl ether;

cyclic ether solvents such as tetrahydrofuran and tetrahydropyran;

aromatic ring-containing ether solvents such as diphenyl ether and anisole; and the like.

Examples of the ketone solvent include:

chain ketone solvents such as acetone, methyl ethyl ketone, methyl n-propyl ketone, methyl n-butyl ketone, diethyl ketone, methyl iso-butyl ketone, 2-heptanone, ethyl n-butyl ketone, methyl n-hexyl ketone, di-iso-butyl ketone and trimethylnonanone;

cyclic ketone solvents such as cyclopentanone, cyclohexanone, cycloheptanone, cyclooctanone and methylcyclohexanone;

2,4-pentanedione, acetonylacetone, and acetophenone; and the like.

Examples of the amide solvent include:

cyclic amide solvents such as N,N'-dimethylimidazolidinone and N-methylpyrrolidone; chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include:

acetic acid ester solvents such as methyl acetate, ethyl acetate, n-propyl acetate, iso-propyl acetate, n-butyl acetate, iso-butyl acetate, sec-butyl acetate, n-pentyl acetate, i-pentyl acetate, sec-pentyl acetate, 3-methoxybuty acetate, methylpentyl acetate, 2-ethylbutyl acetate, 2-ethylhexyl acetate, benzyl acetate, cyclohexyl acetate, methylcyclohexyl acetate and n-nonyl acetate;

polyhydric alcohol partially etherated carboxylate solvents such as ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monomethyl ether propionate, propylene glycol monoethyl ether acetate, propylene glycol monopropyl ether acetate, propylene glycol monobutyl ether acetate, dipropylene glycol monomethyl ether acetate and dipropylene glycol mono ethyl ether acetate;

lactone solvents such as γ-butyrolactone and valerolactone; carbonate solvents such as dimethyl carbonate, diethyl carbonate, ethylene carbonate and propylene carbonate;

glycol diacetate, methoxytriglycol acetate, ethyl propionate, n-butyl propionate, iso-amyl propionate, diethyl oxalate, di-n-butyl oxalate, methyl acetoacetate, ethyl acetoacetate, methyl lactate, ethyl lactate, n-butyl lactate, n-amyl lactate, diethyl malonate, dimethyl phthalate, and diethyl phthalate; and the like.

Examples of the hydrocarbon solvent include:

aliphatic hydrocarbon solvents such as n-pentane, iso-pentane, n-hexane, iso-hexane, n-heptane, iso-heptane, 2,2,4-trimethylpentane, n-octane, iso-octane, cyclohexane and methylcyclohexane;

aromatic hydrocarbon solvents such as benzene, toluene, xylene, mesitylene, ethylbenzene, trimethylbenzene, methylethylbenzene, n-propylbenzene, iso-propylbenzene, diethylbenzene, iso-butylbenzene, triethylbenzene, di-iso-propylbenzene and n-amylnaphthalene; and the like.

Of these, the ester solvent is preferred, the polyhydric alcohol partially etherated carboxylate solvent is more preferred, and propylene glycol monomethyl ether acetate is still more preferred. The composition (II) may contain one type of the solvent (S), or two or more types thereof.

Other Component

The composition (II) may contain, for example, a surfactant and the like as other component. When the composition (II) contains the surfactant, the application property onto the resist pattern 2 may be improved.

The applying procedure of the composition (II) is exemplified by spin coating and the like.

Polymer Layer (C)-Forming Step

In this step, the polymer layer (C) is formed on at least the surface of the substrate or of the other layer.

The procedure of forming the polymer layer (C) is exemplified by a method including a step (hereinafter, may be also referred to as "composition (III)-applying step") of applying a composition (III) containing the polymer (C) and the solvent (S), and the like.

Composition (III)

The composition (III) contains the polymer (C) and the solvent (S). The composition (III) may also contain other component(s) in addition to the polymer (C) and the solvent (S).

Polymer (C)

The polymer (C) preferably has functional group (2) that bonds to at least one end of a main chain thereof, and is capable of forming a chemical bond with at least one of Si—H, Si—OH, Si=O and Si—NR$_2$ (wherein, two Rs each independently represent a hydrogen atom or a monovalent organic group having 1 to 20 carbon atoms).

Examples of the functional group (2) include a carboxy group, a hydroxyl group, a halogen atom and the like. These functional groups form covalent bonds with Si—H, Si—OH, Si=O and/or Si—NR$_2$.

The polymer (C) is exemplified by a styrene polymer, a (meth)acrylic polymer, an ethylene polymer, a copolymer of a combination thereof, and the like. These polymers may be, for example, similar polymers to those exemplified as the polymer (B), and the like.

The lower limit of the weight average molecular weight (Mw) of the polymer (C) is preferably 1,000, more preferably 3,000, still more preferably 4,000, and particularly preferably 5,000. The upper limit of Mw is preferably 100,000, more preferably 50,000, still more preferably 20,000, and particularly preferably 10,000.

The upper limit of the ratio (dispersity index) of the Mw to the number average molecular weight (Mn) of the polymer (C) is preferably 5, more preferably 3, even more preferably 2 and particularly preferably 1.4. The lower limit of the ratio is typically 1, and preferably 1.1.

The lower limit of the content of the polymer (C) in the composition (III) with respect to the total solid content is preferably 80% by mass, more preferably 90% by mass, and still more preferably 95% by mass. The upper limit of the content is, for example, 100% by mass.

The solvent (S) and the other component(s) in the composition (III) may be similar to those exemplified as the solvent (S) and the other component(s) of the composition (II), and the like.

The applying procedure of the composition (III) is exemplified by spin coating and the like.

Alternatively, in the case of simultaneously carrying out the polymer layer (B)-forming step and the polymer layer (C)-forming step in the polymer layer-forming step, a step (hereinafter, may be also referred to as "composition (IV)-applying step") of applying a composition (hereinafter, may be also referred to as "composition (IV)") containing the polymer (B), the polymer (C) and the solvent (S) may be carried out.

Composition (IV)

The composition (IV) contains the polymer (B), the polymer (C) and the solvent (S). The composition (IV) may also contain other component(s) in addition to the polymer (B), the polymer (C) and the solvent (S).

The polymer (B), the polymer (C), the solvent (S) and the other component(s) in the composition (IV) may be similar to those exemplified as the solvent (S) and other components for the composition (II), and the like.

The lower limit of the total content of the polymer (B) and the polymer (C) with respect to the total solid content in the composition (IV) is preferably 80% by mass, more preferably 90% by mass, and still more preferably 95% by mass. The upper limit of the content is, for example, 100% by mass.

Synthesis Process of Polymer (B) and Polymer (C)

The polymer (B) and the polymer (C) may be synthesized by polymerization such as anionic polymerization or radical polymerization, and living anionic polymerization in which an arbitrary terminal structure can be readily introduced is preferred. The living anionic polymerization enables a functional group bonding to the end of a main chain of a polymer to be introduced by polymerizing a monomer such as, for example, styrene, and subjecting the polymerization end to a treatment with an arbitrary end treatment agent.

For example, in a case in which a polymer constituted with a polystyrene block having the functional group (1) or the functional group (2) at the end thereof is to be synthesized, styrene is polymerized first by using an anionic polymerization initiator in an appropriate solvent to form a styrene polymer having an active end. Thereafter, the styrene polymer is subjected to a treatment with an end treatment agent that is capable of giving the functional group (1) or the functional group (2), thereby enabling a polymer to be obtained having the functional group introduced at the end of the main chain of polystyrene.

In other words, the procedure of the end treatment described above is exemplified by a process as indicated by the following scheme, and the like. In brief, an end treatment agent such as, for example, 1,2-butylene oxide is added to the active end during polymerization to modify the end, whereby the polymer having the functional group bonded to the end of the main chain is obtained.

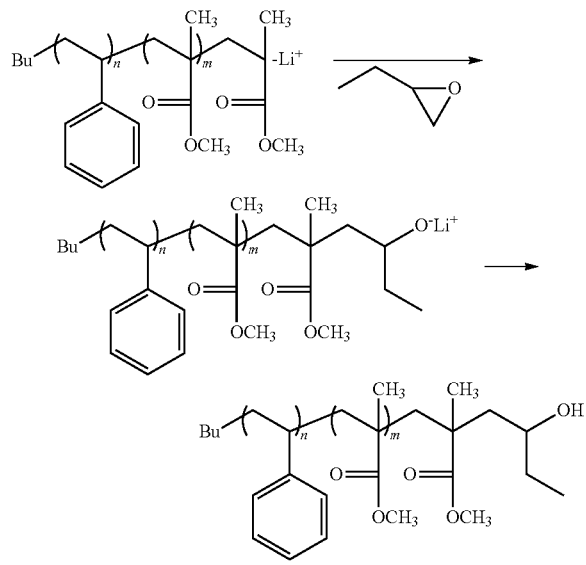

In the above scheme, n and m are an integer of 10 to 5,000.

Examples of the end treatment agent that gives a hydroxyl group include: epoxy compounds such as 1,2-butylene oxide, butyl glycidyl ether, 2-ethylhexyl glycidyl ether, propylene oxide, ethylene oxide, styrene oxide and epoxyamine, and the like.

Examples of the end treatment agent that gives a carboxy group include carbon dioxide, and the like.

Examples of the end treatment agent that gives a epoxy group include halogen atom-containing epoxy compounds such as epibromohydrin and epichlorohydrin, and the like.

Examples of the end treatment agent that gives a oxetanyl group include halogen atom-containing oxetane compounds such as 3-chloromethyl-3-methyloxetane and 3-chloromethyl-3-ethyloxetane, and the like.

Alternatively, the having a carboxy group at the end may be obtained by carrying out Reversible Addition Fragmentation Chain Transfer polymerization (RAFT polymerization), for example, of a monomer such as styrene with methyl 4-cyano-4-[(dodecylsulfanylthiocarbonylsulfane] pentanoate or the like in a solvent such as anisole.

The polymer having a halogen atom at the end may be synthesized by atom transfer radical polymerization through charging, for example: a monomer such as styrene; copper (II) bromide; an amine compound such as tris[(2-dimethylamino)ethyl]amine; and a solvent such as anisole, and adding thereto a halogenated compound such as 2-hydroxyethyl 2-bromoisobutyrte.

The polymer (B) and the polymer (C) thus obtained are preferably recovered by a reprecipitation technique. More specifically, after completing the end treatment reaction, the reaction liquid is charged into a reprecipitation solvent to recover the intended copolymer in the form of powder. As the reprecipitation solvent, an alcohol, an alkane and the like may be used either alone or as a mixture of two or more thereof. As an alternative to the reprecipitation technique, a liquid separating operation, column operation, ultrafiltration operation or the like may be employed to recover the polymer through eliminating low molecular components such as monomers and oligomers. In addition, the polymer (B) and the polymer (C) are preferably purified by a demetallation treatment or the like with an acid, etc.

Preparation Procedure of Compositions (II) to (IV)

The compositions (II) to (IV) may be prepared by, for example, mixing the polymer (B) and/or the polymer (C), the solvent (S) and as needed, other component(s) at a predetermined ratio, and preferably filtering the resulting mixture through a high-density polyethylene filter having a pore size of about 0.45 μm, etc. The lower limit of the solid content concentration of the compositions (II) to (IV) is preferably 0.1% by mass, more preferably 0.5% by mass, and still more preferably 0.7% by mass. The upper limit of the solid content concentration is preferably 30% by mass, more preferably 10% by mass, and still more preferably 3% by mass.

Order of Each Step in Base Pattern-Forming Step

In the case in which the base pattern-forming step includes the resist pattern-forming step, the polymer layer (B)-forming step and the polymer layer (C)-forming step, each of these steps may be carried out in any order as described in the following. More specifically, the base pattern-forming step may be carried out, for example, in any of the following orders of:

(1) the resist pattern-forming step, the polymer layer (B)-forming step and the polymer layer (C)-forming step;

(2) the resist pattern-forming step, the polymer layer (C)-forming step and the polymer layer (B)-forming step;

(3) the polymer layer (C)-forming step, the resist pattern-forming step and the polymer layer (B)-forming step, or the like. Of these, in light of more accurate formation of the polymer layer (B) and the polymer layer (C) being enabled, the orders of (1) and (3) are preferred.

In the case in which the base pattern-forming step includes the resist pattern-forming step, the composition (II)-applying step and the composition (III)-applying step, the order of carrying out each of these steps may be:

(A) the resist the pattern-forming step, the composition (II)-applying step and the composition (III)-applying step;

(B) the resist pattern-forming step, the composition (III)-applying step and the composition (II)-applying step;

(C) order of the composition (III)-applying step, the resist pattern-forming step and the composition (II)-applying step, or the like. Of these, in light of more accurate formation of the polymer layer (B) and the polymer layer (C) being enabled, the orders of (A) and (C) are preferred.

In the base pattern-forming step, when the composition (IV)-applying step is carried out, in light of more accurate formation of the polymer layer (B) and the polymer layer (C) being enabled, it is preferred that the resist pattern-forming step is carried out, and after this step, the composition (IV)-applying step is carried out.

Filling Step

In this step, the recessed portions of the base pattern (I) are filled with the composition (I) containing the polymer (A) and the solvent.

Composition (I)

The composition (I) contains the polymer (A) and a solvent. The composition (I) may also contain other component(s) in addition to the polymer (A) and the solvent.

(A) Polymer

The polymer (A) has at least two blocks. In other words, the polymer (A) is a block copolymer.

The polymer (A) may be a diblock copolymer, a triblock copolymer, or a copolymer having four or more blocks. Of these, in light of ease in forming the phase separation structure, a diblock copolymer and a triblock copolymer are preferred, and a diblock copolymer is more preferred. Also, the polymer (A) may have a linking group between adjacent blocks.

In the case in which the polymer (A) is a diblock copolymer, the polymer (A) has a block (I) and a block (II). The polarity of the structural unit constituting the block (II) is higher than that of the block (I).

Block (I)

The block (I) is exemplified by a polystyrene block, and the like. The polystyrene block is a block that includes a structural unit derived from substituted or unsubstituted styrene. Of these, a block that includes a structural unit derived from styrene is preferred.

Block (II)

Examples of the block (II) include a poly(meth)acrylic acid ester block, a polyalkylene glycol block, a polyester block, a polyalkylenecarbonate block, a polydialkylsiloxane block, a poly(meth)acrylic acid alkylsilyl ester block, and the like. The poly(meth)acrylic acid ester block is a block that includes a structural unit derived from a (meth)acrylic acid ester. Of these, the poly(meth)acrylic acid ester block is preferred, an poly(alkyl (meth)acrylate) block is more preferred, a poly(methyl (meth)acrylate) block is still more preferred, and a poly(methyl methacrylate) block is particularly preferred.

Linking Group

The linking group is exemplified by a divalent organic group having 1 to 50 carbon atoms, and the like. Examples of the monomer that gives the linking group include diphenylethylene, stilbene, and the like. Diphenylethylene and stilbene enable stabilization of the anion end generated during the synthesis of the polymer (A) by anion polymerization. Thus, the resulting polymer (A) will have a smaller dispersity index (Mw/Mn ratio), thereby consequently enabling the variance of dimension of the formed pattern to be smaller. The polymer (A) may have one, or two or more linking groups depending on the number of blocks, intended pattern configuration, and the like.

The lower limit of the weight average molecular weight (Mw) of the polymer (A) as determined by gel permeation chromatography (GPC) is preferably 1,000, more preferably 10,000, and still more preferably 50,000. The upper limit of the Mw is preferably 300,000, more preferably 200,000, and still more preferably 100,000. When the Mw of the polymer (A) falls within the above range, formation of a contact hole pattern is enabled with more inhibited placement errors and with more reduced residues at the bottom.

The upper limit of the ratio (Mw/Mn, dispersity index) of the Mw to the number average molecular weight (Mn) of the polymer (A) is preferably 5, more preferably 3, still more preferably 2, particularly preferably 1.5, and further particularly preferably 1.1. The lower limit of the ratio is typically 1, and preferably 1.01. When the Mw/Mn ratio falls within the above range, formation of a contact hole pattern is enabled with more inhibited placement errors and with more reduced residues at the bottom.

The lower limit of the content of the polymer (A) with respect to the total solid content in the composition (I) is preferably 80% by mass, more preferably 90% by mass, still more preferably 95% by mass, and particularly preferably 99% by mass. The "total solid content" of the composition (I) as referred to means the sum of the components other than the solvent.

The lower limit of the concentration of the polymer (A) in the composition (I) is preferably 0.3% by mass, more preferably 0.7% by mass, still more preferably 1.0% by mass, and particularly preferably 1.3% by mass. Meanwhile, the upper limit of the concentration is preferably 5% by mass, more preferably 3% by mass, still more preferably 2% by mass, and particularly preferably 1.7% by mass.

Synthesis Method of Polymer (A)

The polymer (A) may be synthesized by living anionic polymerization, living radical polymerization or the like, and the living anionic polymerization is more preferred. For example, the polymer (A) may be synthesized by linking the polystyrene block, the poly(methyl methacrylate) block and a block other than these in a desired order while polymerization is permitted, and subjecting the polymerization end to a treatment with an arbitrary end treatment agent.

Examples of the solvent for use in the polymerization include:

alkanes such as n-pentane, n-hexane, n-heptane, n-octane, n-nonane and n-decane;

alicyclic hydrocarbons such as cyclohexane, cycloheptane, cyclooctane, decalin and norbornane;

aromatic hydrocarbons such as benzene, toluene, xylene, ethylbenzene and cumene;

saturated carboxylic acid esters such as ethyl acetate, n-butyl acetate, i-butyl acetate and methyl propionate;

ketones such as acetone, methyl ethyl ketone, 4-methyl-2-pentanone and 2-heptanone;

ethers such as tetrahydrofuran, dimethoxyethane and diethoxyethane;

alcohols such as methanol, ethanol, 1-propanol, 2-propanol and 4-methyl-2-pentanol; and the like. These solvents may be used either alone, or two or more types thereof may be used in combination.

The reaction temperature in the polymerization may be appropriately selected depending on the type of the initiator, and the lower limit of the reaction temperature is preferably −150° C., and more preferably −80° C. The upper limit of the reaction temperature is preferably 50° C., and more preferably 40° C. The lower limit of the reaction time period is preferably 5 min, and more preferably 20 min. The upper limit of the reaction time period is preferably 24 hrs, and more preferably 12 hrs.

Examples of the initiator for use in the polymerization include alkyllithium, alkylmagnesium halide, naphthalene sodium, an alkylated lanthanoid compound, and the like. Of these, when the polymerization is carried out by using styrene, methyl methacrylate or the like as a monomer, the alkyllithium compound is preferably used.

With respect to the procedure for the end treatment, an end treatment agent, e.g., an alcohol such as methanol, or an epoxy compound such as 2-ethylhexyl glycidyl ether is added to modify the ends of chains in the polymerization reaction, whereby a predetermined block copolymer can be obtained. The block copolymer thus obtained is preferably purified by a demetallation treatment or the like.

Phase Separation Step

Figure 4:
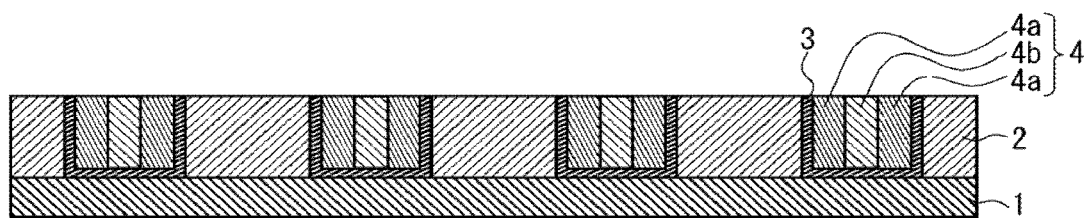
FIG. 4 is a schematic cross sectional view illustrating one example of a state after permitting phase separation in the filler layer shown in FIG. 3.

In this step, phase separation is permitted in the filler layer 4 formed by the filling step. Accordingly, phase separation occurs in the filler layer 4 to give a block (α) phase 4a and a block (β) phase 4b, as shown in FIG. 4.

An exemplary procedure for the phase separation of the filler layer 4 includes annealing, or the like.

The technique for the annealing is exemplified by heating, and the like. Heating means may involve, for example, an oven, a hot plate, and the like. The lower limit of the temperature of the heating is preferably 80° C., more preferably 100° C., and still more preferably 150° C. The upper limit of the temperature of the heating is preferably 400° C., more preferably 350° C., and still more preferably 300° C. The lower limit of the time period of the heating is preferably 10 sec, more preferably 1 min, and still more preferably 10 min. The upper limit of the time period of the heating is preferably 120 min, more preferably 60 min, and still more preferably 30 min.

Removing Step

Figure 5:
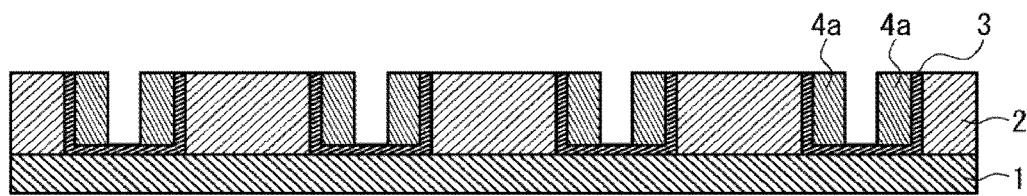
FIG. 5 is a schematic cross sectional view illustrating one example of a state after removing a part of phases of the filler layer following the phase separation shown in FIG. 4.

In this step, a part of phases of the filler layer after the phase separation step is removed. For example, the block (β) phase 4b that is one of the phases of the filler layer provided after the phase separation step shown in FIG. 4 is removed, whereby a miniaturized pattern constituted from the resist pattern 2, the polymer layer 3 and the filler layer 4a not having been removed is formed as shown in FIG. 5.

In the removing step, for example, the block (β) phase 4b that is a part of the phase separation structure included in the filler layer 4 as shown in FIG. 4 is removed. For example, by way of the difference in etching rates of the phases provided after the phase separation, the poly(methyl methacrylate) block phase 4b can be removed by an etching treatment. The state after removing the poly(methyl methacrylate) block phase 4b in the phase separation structure is shown in FIG. 5. It is to be noted that an irradiation with a radioactive ray may be conducted as needed prior to the etching treatment. As the radioactive ray, in a case where the poly(methyl methacrylate) block phase is to be removed by the etching, a radioactive ray of 172 nm may be used. The irradiation with the radioactive ray will result in degradation of the poly(methyl methacrylate) block phase, whereby the etching may be facilitated.

The removing procedure of the poly(methyl methacrylate) block phase 4b in the phase separation structure is exemplified by known techniques including: reactive ion etching (RIE) such as chemical dry etching and chemical wet etching; physical etching such as sputtering etching and ion beam etching. Of these, the reactive ion etching is preferred, the chemical dry etching carried out using $CF_4$, an $O_2$ gas or the like and the chemical wet etching carried out by using an etching liquid such as an organic solvent or hydrofluoric acid are more preferred, and the chemical wet etching is still more preferred.

Examples of the organic solvent for use in the chemical wet etching include:

alkanes such as n-pentane, n-hexane and n-heptane;
cycloalkanes such as cyclohexane, cycloheptane and cyclooctane;
saturated carboxylic acid esters such as ethyl acetate, n-butyl acetate, i-butyl acetate and methyl propionate;
ketones such as acetone, methyl ethyl ketone, methyl isobutyl ketone (MIBK) and methyl n-pentyl ketone;
alcohols such as methanol, ethanol, 1-propanol, isopropanol (IPA) and 4-methyl-2-pentanol; and the like. These solvents may be used either alone, or two or more types thereof may be used in combination. Of these, a mixed solvent of MIBK and IPA is preferred.

Etching Step

In this step, the substrate is etched by directly or indirectly using the miniaturized pattern formed by the removing step. The miniaturized pattern is constituted from the base pattern (I) 2, the polymer layer 3 and the block (α) phase not having been removed in the removing step, as shown in FIG. 5. This step results in formation of a substrate pattern. The pattern-forming method (A) enables a substrate pattern with inhibited placement errors and with favorable shape to be obtained.

In the case in which the base pattern (I) 2 is directly formed on the front face side of the substrate 1 in the base pattern-forming step, the etching is typically carried out once by directly using the miniaturized pattern to provide the substrate pattern. In the case in which the base pattern (I) is formed on the front face side of the substrate 1 via other layer, typically, the miniaturized pattern is indirectly used, in other words, etching is carried out several times through etching the other layer by using the miniaturized pattern, and then sequentially carrying out etching by using the etched other layer as a mask to provide the substrate pattern.

The substrate pattern obtained may be, for example, a hole pattern and the like.

The etching procedure is exemplified by well-known techniques including: reactive ion etching (RIE) such as chemical dry etching carried out using $CF_4$, an $O_2$ gas or the like by utilizing the difference in etching rate of each layer, etc., as well as chemical wet etching (wet development) carried out by using an etching liquid such as an organic solvent or hydrofluoric acid; physical etching such as sputtering etching and ion beam etching. Of these, the reactive ion etching is preferred, the chemical dry etching and the chemical wet etching are more preferred, and the chemical dry etching is still more preferred.

After completion of the patterning onto the substrate, the portions used as a mask are removed from the front face side of the substrate by a dissolving treatment or the like, whereby a substrate having the formed pattern can be finally obtained. The substrate obtained by the pattern-forming method (A) is suitably used for semiconductor elements and the like, and the semiconductor elements are widely used for LED, solar cells, and the like.

Pattern-Forming Method (B)

The pattern-forming method (B) includes the base pattern-overlaying step, the applying step, the heating step, the filling step, the phase separation step, the removing step and the etching step.

The pattern-forming method (B) includes each step described above, and the difference in contact angles between the sides of the lateral faces and the bottom faces of the recessed portions of the base pattern on the coating film after the heating step is greater than the value defined above, whereby formation of a miniaturized pattern superior in pattern size uniformity is enabled. In turn, by using such a superior miniaturized pattern, formation of a pattern of a substrate with favorable shape and arrangement is enabled.

Although not necessarily clarified and without wishing to be bound by any theory, the reason for achieving the effects described above by the pattern-forming method (B) due to the aforementioned constitution is inferred as in the following, for example. Due to the difference in contact angles between the sides of the lateral faces and the bottom faces of the recessed portions of the base pattern after the heating step being greater than the value defined above, phase separation in the filler layer of the polymer (A') subsequently formed in the recessed portions is considered to more appropriately occur, and as a result, formation of the miniaturized pattern superior in pattern size uniformity would be enabled. Hereinafter, each step will be described.

Base Pattern-Overlaying Step

In this step, a base pattern (hereinafter, may be also referred to as "base pattern (II)") is overlaid on a front face side of a substrate directly or via other layer. It is preferred that the base pattern (II) is overlaid directly on the substrate. The base pattern (II) contains as a principal component, a polymer having a proportion of the aromatic ring contained being no less than 50% by mass. For example, the resist underlayer film, etc., may contain as a principal component, the polymer having a proportion of the aromatic ring contained being no less than 50% by mass.

An exemplary procedure for overlaying the base pattern (II) is as in the following. A resist underlayer film is formed on a front face side of a substrate directly or via other layer. Next, as needed, an SOG film may be formed on a front face side of the resist underlayer film. A resist pattern is then formed on the front face side of the resist underlayer film or on a front face side of the SOG film. Thereafter, the SOG film and/or the resist underlayer film are/is sequentially etched by using the resist pattern as a mask.

The substrate and the other layer, and the forming method of the resist underlayer film, the SOG film and the resist pattern are similar to those exemplified in connection with the base pattern-forming step of the pattern-forming method (A), and the like. As the substrate, a silicon substrate is preferred.

Applying Step

In this step, the composition (V) is applied on the lateral faces and the bottom faces of the recessed portions of the base pattern (II).

Composition (V)

The composition (V) contains the polymer (A') and the solvent (solvent (S)). The composition (V) may contain other component(s) such as a surfactant in addition to the polymer (A') and the solvent (S).

(A') Polymer

The polymer (A') has the structural unit (I). The structural unit (I) is exemplified by a structural unit derived from a substituted or unsubstituted styrene, a structural unit derived from (meth)acrylic acid or a (meth)acrylic acid ester, a structural unit derived from a substituted or unsubstituted ethylene, and the like. Examples of the substituted or unsubstituted styrene, the (meth)acrylic acid ester and the substituted or unsubstituted ethylene are similar to those exemplified in connection with the polymer (B) in the pattern-forming method (A), and the like.

The polymer (A') preferably has the functional group that bonds to at least one end of a main chain thereof, and is capable of forming a chemical bond with at least one of —COOH and —OH. Such a functional group may be, for example, the functional group exemplified as the functional group (1) of the polymer (B) in the pattern-forming method (A), and the like.

The preferred range of the Mw and the Mw/Mn of the polymer (A'), and the content of the polymer (A') in the composition (V) are similar to those for the polymer (B) and the composition (II) in the pattern-forming method (A).

The solvent (S) may be, for example, solvent to the solvent exemplified as the solvent (S) of the composition (II) in the pattern-forming method (A), and the like.

Preparation Method of Composition (V)

The composition (V) may be prepared by, for example, mixing the polymer (A'), the solvent (S) and as needed, other component(s) at a predetermined ratio, and preferably filtering the resulting mixture through a membrane filter having a polar size of about 200 nm, etc. The lower limit of the solid content concentration of the composition (V) is preferably 0.1% by mass, more preferably 0.5% by mass, and still more preferably 0.7% by mass. The upper limit of the solid content concentration is preferably 30% by mass, more preferably 10% by mass, and still more preferably 3% by mass.

The applying procedure of the composition (V) is exemplified by spin coating and the like.

Heating Step

In this step, the coating film formed by the applying step is heated. The difference in contact angles ($|\theta 1-\theta 2|$, wherein $|\theta 1-\theta 2|$ means the absolute value of the difference ($\theta 1-\theta 2$)) is no less than 5°, wherein in recessed portions of the base pattern in the coating film after the heating step, a lateral face side has a contact angle of water of $\theta 1$, and a bottom face side has a contact angle of water of $\theta 2$. In this regard, a greater value may be either $\theta 1$ or $\theta 2$.

The lower limit of the difference between $\theta 1$ and $\theta 2$ is preferably 7°, and more preferably 10°. The upper limit of the difference between $\theta 1$ and $\theta 2$ is, for example, 30°.

The lower limit of $\theta 1$ is preferably 50°, and more preferably 80°. The upper limit of $\theta 1$ is preferably 90°, and more preferably 88°. The lower limit of $\theta 2$ is preferably 60°, and more preferably 70°. The upper limit of $\theta 2$ is preferably 85°, and more preferably 80°.

Heating means may involve, for example, an oven, a hot plate, and the like.

In the heating step, the temperature or the time period is controlled such that the difference between $\theta 1$ and $\theta 2$ will be the value as defined above or greater. The temperature and the time period in the heating step may vary depending on, for example, the type of the functional group included in the polymer (A') in the composition (V), and the like.

The lower limit of the temperature of the heating is preferably 50° C., more preferably 100° C., still more preferably 120° C., and particularly preferably 140° C. The upper limit of the temperature of the heating is preferably The upper limit of the temperature of the heating is preferably 250° C., more preferably 200° C., still more preferably 180° C., and particularly preferably 160° C.

The lower limit of the time period of the heating is preferably 10 sec, more preferably 1 min, still more preferably 5 min, and particularly preferably 10 min. The upper limit of the time period of the heating is preferably 10 hrs, more preferably 1 hour, still more preferably 30 min, and particularly preferably 20 min.

Filling Step

In this step, the recessed portions of the base pattern on which the coating film has been overlaid are filled with the composition (VI).

Composition (VI)

The composition (VI) contains the polymer (B') and the solvent (solvent (S)). The composition (VI) may also contain other component(s) in addition to the polymer (B') and the solvent (S).

(B') Polymer

The polymer (B') has the block (A) and the block (B). In other words, the polymer (B') is a block copolymer. The block (A) is constituted from the structural unit (II), and the block (B) is constituted from the structural unit (III) that is more polar than the structural unit (II). The polymer (B') may be a diblock copolymer, a triblock copolymer, or a copolymer having four or more blocks. Of these, in light of ease in forming the phase separation structure, a diblock copolymer and a triblock copolymer are preferred, and a diblock copolymer is more preferred. Also, the polymer (B') may have a linking group between adjacent blocks.

As the block (A), the polystyrene block exemplified as the block (I) of the polymer (A) in the pattern-forming method (A) is preferred. Specifically, the structural unit (II) is preferably the structural unit derived from a substituted or unsubstituted styrene. Examples of the block (B) include the blocks exemplified as the block (II) of the polymer (A), and the like. The block (B) is preferably the poly(meth)acrylic acid ester block, and more preferably the poly(methyl methacrylate) block. The structural unit (III) is preferably the structural unit derived from a (meth)acrylic acid ester.

The Mw and the Mw/Mn of the polymer (B'), and the content and the concentration of the polymer (B') in the composition (VI) preferably fall within the ranges similar to those for the polymer (A) and the composition (I) in the pattern-forming method (A).

Phase Separation Step

In this step, phase separation is permitted in the filler layer formed by the filling step. This step is similar to the phase separation step in the pattern-forming method (A).

Removing Step

In this step, at least a part of phases of the filler layer after the phase separation step is removed. This step is similar to the removing step in the pattern-forming method (A).

Etching Step

In this step, the substrate is etched once or several times by using the miniaturized pattern formed by the removing step. This step is similar to the etching step in the pattern-forming method (A).

Composition

The composition contains: a polymer having a functional group that bonds to at least one end of a main chain thereof and is capable of forming a chemical bond with at least one of —COOH and —OH; a polymer having a functional group that bonds to at least one end of a main chain thereof and is capable of forming a chemical bond with at least one of Si—H, Si—OH, Si=O and Si—NR$_2$ (wherein, two Rs each independently represent a hydrogen atom or a monovalent organic group having 1 to 20 carbon atoms); and a solvent.

In regard to the composition, the description is presented herein as the composition (II) for use in the pattern-forming method (A).

EXAMPLES

Hereinafter, the present invention is explained in detail by way of Examples, but the present invention is not in any way limited to these Examples. Measuring methods for various types of physical properties are shown below.

Mw and Mn

The Mw and the Mn of the polymer were determined by gel permeation chromatography (GPC) using GPC columns (Tosoh Corporation; "G2000 HXL"×2, "G3000 HXL"×1 and "G4000 HXL"×1) under the following conditions:
eluent: tetrahydrofuran (Wako Pure Chemical Industries, Ltd.);
flow rate: 1.0 mL/min;
sample concentration: 1.0% by mass;
amount of sample injected: 100 µL;
column temperature: 40° C.;
detector: differential refractometer; and
standard substance: mono-dispersed polystyrene.

$^1$H-NMR Analysis and $^{13}$C-NMR Analysis $^1$H-NMR analysis or $^{13}$C-NMR Analysis was carried out using a nuclear magnetic resonance apparatus ("JNM-EX400" available from JEOL, Ltd.), with DMSO-d$_6$ for use as a solvent for measurement. The proportion of each structural unit in the polymer was calculated from an area ratio of a peak corresponding to each structural unit on the spectrum obtained by the $^1$H-NMR or $^{13}$C-NMR Analysis.
Pattern-Forming Method (A)
Synthesis of Polymer (A)

Synthesis Example 1-1: Synthesis of Polymer (a-1)

After a 500-mL flask as a reaction vessel was dried under reduced pressure, 200 g of tetrahydrofuran (THF), which had been subjected to a distillation dehydrating treatment, was charged in a nitrogen atmosphere, and cooled to −78° C. Thereafter, 0.29 mL of a 1 N cyclohexane solution of sec-butyllithium (sec-BuLi) (0.256 mmol) was charged into this THF, and then 22.7 mL of styrene (0.197 mol), which had been subjected to adsorptive filtration through silica gel for removing a polymerization inhibitor and to a dehydrating treatment by distillation, was charged by dropwise addition over 30 min. The polymerization system color was ascertained to be orange. During the charging by dropwise addition, the internal temperature of the reaction mixture was carefully controlled so as not to be −60° C. or higher. After completion of the dropwise addition, aging was permitted for 30 min. Subsequently, 0.11 mL of 1,1-diphenylethylene (0.00077 mol) and 1.02 mL of a 0.5 N THF solution (0.0005 mol) of lithium chloride were added to the mixture, and the polymerization system color was ascertained to be dark red. Furthermore, 10.6 mL of methyl methacrylate (0.100 mol), which had been subjected to adsorptive filtration through silica gel for removing a polymerization inhibitor and to a dehydrating treatment by distillation, was charged by dropwise addition to the solution over 30 min. The polymerization system color was ascertained to be light yellow, and thereafter the reaction was allowed to proceed for 120 min. Subsequently, 1 mL of methanol as a chain-end terminator was charged to conduct a terminating reaction of the polymerization end. The temperature of the reaction mixture was elevated to the room temperature, and the resultant reaction mixture was concentrated and replacement with methyl isobutyl ketone (MIBK) was carried out. Thereafter, 1,000 g of a 2% by mass aqueous oxalic acid solution was charged and the mixture was stirred. After the mixture was left to stand, the aqueous underlayer was removed. This operation was repeated three times to remove the Li salt. Thereafter, 1,000 g of ultrapure water was charged and the mixture was stirred, followed by removing the aqueous underlayer. This operation was repeated three times to remove oxalic acid, and then the solution was concentrated. Subsequently, the concentrate was added dropwise to 500 g of methanol to allow the polymer to be precipitated. The solid was collected on a Buechner funnel. Next, in order to remove the polystyrene homopolymer, 500 g of cyclohexane was poured to the solid, whereby the polymer was washed through dissolving the polystyrene homopolymer in cyclohexane. The washing was repeated four times, and again the solid was collected on a Buechner funnel. The solid thus obtained was dried under reduced pressure at 60° C. to give 24.1 g of a polymer (a-1) having white color.

The polymer (a-1) had the Mw of 79,000, the Mn of 77,000, and the Mw/Mn of 1.03. In addition, as a result of the $^1$H-NMR analysis, the polymer (a-1) was revealed to have the proportions of the structural unit derived from styrene and the structural unit derived from methyl methacrylate being 65 mol % and 35 mol %, respectively. It is to be noted that the polymer (a-1) is a diblock copolymer.

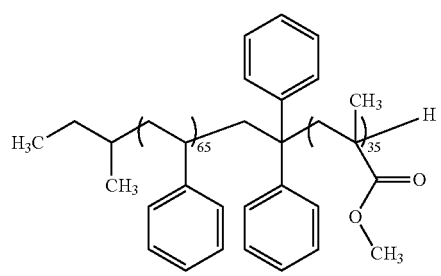

(a-1)

Synthesis Example 1-2: Synthesis of Polymer (a-2)

After a 500-mL, flask as a reaction vessel was dried under reduced pressure, 200 g of THF, which had been subjected to a distillation dehydrating treatment, was charged in a nitrogen atmosphere, and cooled to −78° C. Thereafter, 0.29 mL of a 1 N cyclohexane solution of sec-butyllithium (sec-BuLi) (0.256 mmol) was charged into this THF, and then 22.7 mL of styrene (0.197 mol), which had been subjected to adsorptive filtration through silica gel for removing a polymerization inhibitor and to a dehydrating treatment by distillation, was charged by dropwise addition over 30 min. The polymerization system color was ascertained to be orange. During the charging by dropwise addition, the internal temperature of the reaction mixture was carefully controlled so as not to be −60° C. or higher. After completion of the dropwise addition, aging was permitted for 30 min. Subsequently, 0.11 mL of 1,1-diphenylethylene (0.00077 mol) and 1.02 mL of a 0.5 N tetrahydrofuran solution of lithium chloride (0.0005 mol) were added to the mixture, and the polymerization system color was ascertained to be dark red. Furthermore, 10.6 mL of methyl methacrylate (0.100 mol), which had been subjected to adsorptive filtration through silica gel for removing a polymerization inhibitor and to a dehydrating treatment by distillation, was charged by dropwise addition to the solution over 30 min. The polymerization system color was ascertained to be light yellow, and thereafter the reaction was allowed to proceed for 120 min. Subsequently, after 0.053 mL of 2-ethylhexyl glycidyl ether (0.256 mmol) was added as a chain-end terminator, 1 mL of methanol was charged to conduct a terminating reaction of the polymerization end. The temperature of the reaction mixture was elevated to the room temperature, and the resultant reaction mixture was concentrated and replacement with MIBK was carried out. Thereafter, 1,000 g of a 2% by mass aqueous oxalic acid solution was charged and the mixture was stirred. After the mixture was left to stand, the aqueous underlayer was removed. This operation was repeated three times to remove the Li salt. Thereafter, 1,000 g of ultrapure water was charged and the mixture was stirred, followed by removing the aqueous underlayer. This operation was repeated three times to remove oxalic acid, and then the solution was concentrated. Subsequently, the concentrate was added dropwise to 500 g of methanol to allow the polymer to be precipitated. The solid was collected on a Buechner funnel. Next, in order to remove the polystyrene homopolymer, 500 g of cyclohexane was poured to the solid, whereby the polymer was washed through dissolving the polystyrene homopolymer in cyclohexane. The washing was repeated four times, and again the solid was collected on a Buechner funnel. The solid thus obtained was dried under reduced pressure at 60° C. to give 24.1 g of a polymer (a-2) having white color.

The polymer (a-2) had the Mw of 78,000, the Mn of 76,000, and the Mw/Mn of 1.03. In addition, as a result of the $^1$H-NMR analysis, the polymer (a-2) was revealed to have the proportions of the structural unit derived from styrene and the structural unit derived from methyl methacrylate being 65 mol % and 35 mol %, respectively. It is to be noted that the polymer (a-2) is a diblock copolymer.

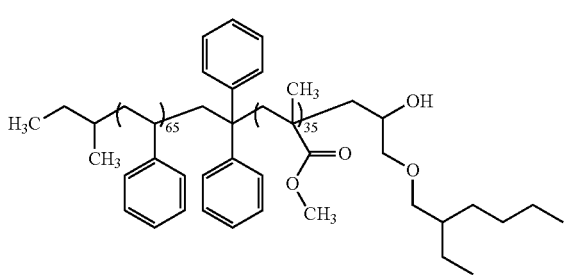

(a-2)

Synthesis Example 1-3: Synthesis of Polymer (a-3)

After a 500-mL flask as a reaction vessel was dried under reduced pressure, 200 g of THF, which had been subjected to a distillation dehydrating treatment, was charged in a nitrogen atmosphere, and cooled to −78° C. Thereafter, 0.28 mL of a 1 N cyclohexane solution of sec-butyllithium (sec-BuLi) (0.256 mmol) was charged into this THF, and then 26.0 mL (0.226 mol) of styrene, which had been subjected to adsorptive filtration through silica gel for removing a polymerization inhibitor and to a dehydrating treatment by distillation, was charged by dropwise addition over 30 min. The polymerization system color was ascertained to be orange. During the charging by dropwise addition, the internal temperature of the reaction mixture was carefully controlled so as not to be −60° C. or higher. After completion of the dropwise addition, aging was permitted for 30 min. Subsequently, 0.11 mL of 1,1-diphenylethylene (0.00077 mol), and 1.02 mL of a 0.5 N tetrahydrofuran solution of lithium chloride (0.0005 mol) were added to the mixture, and the polymerization system color was ascertained to be dark red. Furthermore, 9.5 mL of methyl methacrylate (0.0899 mol), which had been subjected to adsorptive filtration through silica gel for removing a polymerization inhibitor and to a dehydrating treatment by distillation, was charged by dropwise addition to the solution over 30 min. The polymerization system color was ascertained to be light yellow, and thereafter the reaction was allowed to proceed for 120 min. Subsequently, 1 mL of methanol as a chain-end terminator was charged to conduct a terminating reaction of the polymerization end. The temperature of the reaction mixture was elevated to the room temperature, and the resultant reaction mixture was concentrated and replacement with MIBK was carried out. Thereafter, 1,000 g of a 2% by mass aqueous oxalic acid solution was charged and the mixture was stirred. After the mixture was left to stand, the aqueous underlayer was removed. This operation was repeated three times to remove the Li salt. Thereafter, 1,000 g of ultrapure water was charged and the mixture was stirred, followed by removing the aqueous underlayer. This operation was repeated three times to remove oxalic acid, and then the solution was concentrated. Subsequently, the concentrate was added dropwise to 500 g of methanol to allow the polymer to be precipitated. The solid was collected on a Buechner funnel. Next, in order to remove the polystyrene homopolymer, 500 g of cyclohexane was poured to the solid, whereby the polymer was washed through dissolving the polystyrene homopolymer in cyclohexane. The washing was repeated four times, and again the solid was collected on a Buechner funnel. The solid thus obtained was dried under reduced pressure at 60° C. to give 23.8 g of a polymer (a-3) having white color.

The polymer (a-3) had the Mw of 77,000, the Mn of 75,000, and the Mw/Mn of 1.03. In addition, as a result of the $^1$H-NMR analysis, the polymer (a-3) was revealed to have the proportions of the structural unit derived from styrene and the structural unit derived from methyl methacrylate being 70 mol % and 30 mol %, respectively. It is to be noted that the block copolymer (a-3) is a diblock copolymer.

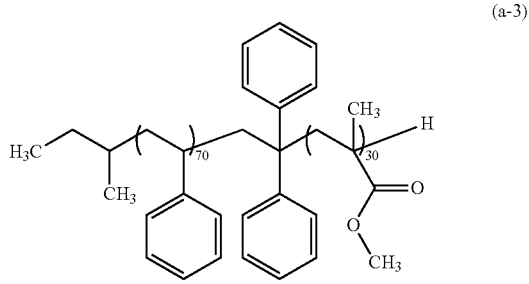

(a-3)

Synthesis of Polymer (B)

Synthesis Example 1-4: Synthesis of Polymer (b-1)

After a 500-mL flask as a reaction vessel was dried under reduced pressure, 120 g of THF, which had been subjected to a distillation dehydrating treatment, was charged in a nitrogen atmosphere, and cooled to −78° C. Thereafter, 2.38 mL of a 1 N cyclohexane solution of sec-butyllithium (sec-BuLi) (2.31 mmol) was charged into this THF, and then 13.3 mL of styrene (0.115 mol), which had been subjected to adsorptive filtration through silica gel for removing a polymerization inhibitor and to a dehydrating treatment by distillation, was charged by dropwise addition over 30 min. The polymerization system color was ascertained to be orange. During the charging by dropwise addition, the internal temperature of the reaction mixture was carefully controlled so as not to be −60° C. or higher. After completion of the dropwise addition, aging was permitted for 30 min. Subsequently, 1 mL of methanol as a chain-end terminator was charged to conduct a terminating reaction of the polymerization end. The temperature of the reaction mixture was elevated to the room temperature, and the resultant reaction mixture was concentrated and replacement with MIBK was carried out. Thereafter, 1,000 g of a 2% by mass aqueous oxalic acid solution was charged and the mixture was stirred. After the mixture was left to stand, the aqueous underlayer was removed. This operation was repeated three times to remove the Li salt. Thereafter, 1,000 g of ultrapure water was charged and the mixture was stirred, followed by removing the aqueous underlayer. This operation was repeated three times to remove oxalic acid, and then the solution was concentrated. Subsequently, the concentrate was added dropwise to 500 g of methanol to allow the polymer to be precipitated. The solid was collected on a Buechner funnel. The solid thus obtained was dried under reduced pressure at 60° C. to give 11.7 g of a polymer (b-1) having white color.

The polymer (b-1) had the Mw of 5,600, the Mn of 5,300, and the Mw/Mn of 1.06.

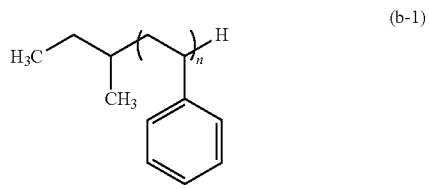

(b-1)

Synthesis Example 1-5: Synthesis of Polymer (b-2)

After a 500-mL flask as a reaction vessel was dried under reduced pressure, 120 g of THF, which had been subjected to a distillation dehydrating treatment, was charged in a nitrogen atmosphere, and cooled to −78° C. Thereafter, 2.38 mL of a 1 N cyclohexane solution of sec-butyllithium (sec-BuLi) (2.30 mmol) was charged into this THF, and then 13.3 mL of styrene (0.115 mol), which had been subjected to adsorptive filtration through silica gel for removing a polymerization inhibitor and to a dehydrating treatment by distillation, was charged by dropwise addition over 30 min. The polymerization system color was ascertained to be orange. During the charging by dropwise addition, the internal temperature of the reaction mixture was carefully controlled so as not to be −60° C. or higher. After completion of the dropwise addition, aging was permitted for 30 min. Subsequently, as a chain-end terminator, 0.27 mL of styrene oxide (2.30 mmol) and then 1 mL of methanol were charged to conduct a terminating reaction of the polymerization end. The temperature of the reaction mixture was elevated to the room temperature, and the resultant reaction mixture was concentrated and replacement with MIBK was carried out. Thereafter, 1,000 g of a 2% by mass aqueous oxalic acid solution was charged and the mixture was stirred. After the mixture was left to stand, the aqueous underlayer was removed. This operation was repeated three times to remove the Li salt. Thereafter, 1,000 g of ultrapure water was charged and the mixture was stirred, followed by removing the aqueous underlayer. This operation was repeated three times to remove oxalic acid, and then the solution was concentrated. Subsequently, the concentrate was added dropwise to 500 g of methanol to allow the polymer to be precipitated. The solid was collected on a Buechner funnel. The solid thus obtained was dried under reduced pressure at 60° C. to give 11.7 g of a polymer (b-2) having white color.

The block copolymer (b-2) had the Mw of 5,500, the Mn of 5,100, and the Mw/Mn of 1.08.

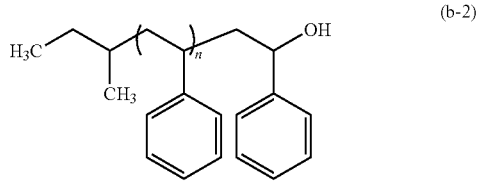

Synthesis Example 1-6: Synthesis of Polymer (b-3)

After a 500-mL flask as a reaction vessel was dried under reduced pressure, 120 g of THF, which had been subjected to a distillation dehydrating treatment, was charged in a nitrogen atmosphere, and cooled to −78° C. Thereafter, 2.38 mL of a 1 N cyclohexane solution of sec-butyllithium (sec-BuLi) (2.30 mmol) was charged into this THF, and then 13.3 mL of styrene (0.115 mol), which had been subjected to adsorptive filtration through silica gel for removing a polymerization inhibitor and to a dehydrating treatment by distillation, was charged by dropwise addition over 30 min. The polymerization system color was ascertained to be orange. During the charging by dropwise addition, the internal temperature of the reaction mixture was carefully controlled so as not to be −60° C. or higher. After completion of the dropwise addition, aging was permitted for 30 min. Subsequently, as a chain-end terminator, carbon dioxide was bubbled and then 1 mL of methanol was charged to conduct a terminating reaction of the polymerization end. The temperature of the reaction mixture was elevated to the room temperature, and the resultant reaction mixture was concentrated and replacement with MIBK was carried out. Thereafter, 1,000 g of a 2% by mass aqueous oxalic acid solution was charged and the mixture was stirred. After the mixture was left to stand, the aqueous underlayer was removed. This operation was repeated three times to remove the Li salt. Thereafter, 1,000 g of ultrapure water was charged and the mixture was stirred, followed by removing the aqueous underlayer. This operation was repeated three times to remove oxalic acid, and then the solution was concentrated. Subsequently, the concentrate was added dropwise to 500 g of methanol to allow the polymer to be precipitated. The solid was collected on a Buechner funnel. The solid thus obtained was dried under reduced pressure at 60° C. to give 11.3 g of a polymer (b-3) having white color.

The polymer (b-3) had the Mw of 5,200, the Mn of 5,000, and the Mw/Mn of 1.04.

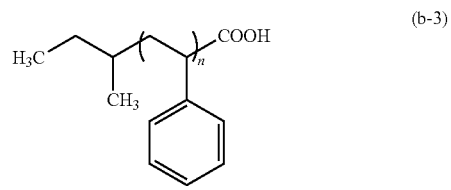

Synthesis Example 1-7: Synthesis of Polymer (b-4)

After a 500-mL flask as a reaction vessel was dried under reduced pressure, 120 g of THF, which had been subjected to a distillation dehydrating treatment, was charged in a nitrogen atmosphere, and cooled to −78° C. Thereafter, 2.38 mL of a 1 N cyclohexane solution of sec-butyllithium (sec-BuLi) (2.30 mmol) was charged into this THF, and then 13.3 mL of styrene (0.115 mol), which had been subjected to adsorptive filtration through silica gel for removing a polymerization inhibitor and to a dehydrating treatment by distillation, was charged by dropwise addition over 30 min. The polymerization system color was ascertained to be orange. During the charging by dropwise addition, the internal temperature of the reaction mixture was carefully controlled so as not to be −60° C. or higher. After completion of the dropwise addition, aging was permitted for 30 min. Subsequently, 0.19 mL of epibromohydrin (2.30 mmol) was charged to conduct a terminating reaction of the polymerization end. The temperature of the reaction mixture was elevated to the room temperature, and the resultant reaction mixture was concentrated and replacement with MIRK was carried out. Thereafter, 1,000 g of a 2% by mass aqueous oxalic acid solution was charged and the mixture was stirred. After the mixture was left to stand, the aqueous underlayer was removed. This operation was repeated three times to remove the Li salt. Thereafter, 1,000 g of ultrapure water was charged and the mixture was stirred, followed by removing the aqueous underlayer. This operation was repeated three times to remove oxalic acid, and then the solution was concentrated. Subsequently, the concentrate was added dropwise to 500 g of methanol to allow the polymer to be precipitated. The solid was collected on a Buechner funnel. The solid thus obtained was dried under reduced pressure at 60° C. to give 11.1 g of a polymer (b-4) having white color.

The polymer (b-4) had the Mw of 5,700, the Mn of 5,200, and the Mw/Mn of 1.10.

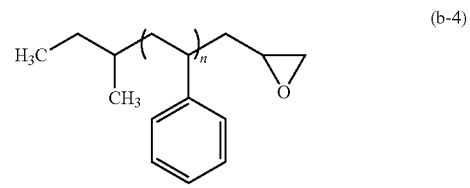

Synthesis Example 1-8: Synthesis of Polymer (b-5)

After a 500-mL flask as a reaction vessel was dried under reduced pressure, 120 g of THF, which had been subjected to a distillation dehydrating treatment, was charged in a nitrogen atmosphere, and cooled to −78° C. Thereafter, 3.95 mL of a 1 N cyclohexane solution of sec-butyllithium (sec-BuLi) (3.84 mmol) was charged into this THF, and then 13.3 mL of styrene (0.115 mol), which had been subjected to adsorptive filtration through silica gel for removing a polymerization inhibitor and to a dehydrating treatment by distillation, was charged by dropwise addition over 30 min. The polymerization system color was ascertained to be orange. During the charging by dropwise addition, the internal temperature of the reaction mixture was carefully controlled so as not to be −60° C. or higher. After completion of the dropwise addition, aging was permitted for 30 min Subsequently, 0.32 mL of epibromohydrin (3.84 mmol) was charged to conduct a terminating reaction of the polymerization end. The temperature of the reaction mixture was elevated to the room temperature, and the resultant reaction mixture was concentrated and replacement with MIBK was carried out. Thereafter, 1,000 g of a 2% by mass aqueous oxalic acid solution was charged and the mixture was stirred. After the mixture was left to stand, the aqueous underlayer was removed. This operation was repeated three times to remove the Li salt. Thereafter, 1,000 g of ultrapure water was charged and the mixture was stirred, followed by removing the aqueous underlayer. This operation was repeated three times to remove oxalic acid, and then the solution was concentrated. Subsequently, the concentrate was added dropwise to 500 g of methanol to allow the polymer to be precipitated. The solid was collected on a Buechner funnel. The solid thus obtained was dried under reduced pressure at 60° C. to give 11.1 g of a polymer (b-5) having white color.

The polymer (b-5) had the Mw of 3,300, the Mn of 3,100, and the Mw/Mn of 1.06.

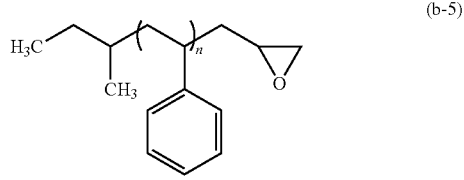

(b-5)

Synthesis Example 1-9: Synthesis of Polymer (b-6)

After a 500-mL flask as a reaction vessel was dried under reduced pressure, 120 g of THF, which had been subjected to a distillation dehydrating treatment, was charged in a nitrogen atmosphere, and cooled to −78° C. Thereafter, 1.19 mL of a 1 N cyclohexane solution of sec-butyllithium (sec-BuLi) (1.15 mmol) was charged into this THF, and then 13.3 mL of styrene (0.115 mol), which had been subjected to adsorptive filtration through silica gel for removing a polymerization inhibitor and to a dehydrating treatment by distillation, was charged by dropwise addition over 30 min. The polymerization system color was ascertained to be orange. During the charging by dropwise addition, the internal temperature of the reaction mixture was carefully controlled so as not to be −60° C. or higher. After completion of the dropwise addition, aging was permitted for 30 min. Subsequently, 0.10 mL of epibromohydrin (1.15 mmol) was charged to conduct a terminating reaction of the polymerization end. The temperature of the reaction mixture was elevated to the room temperature, and the resultant reaction mixture was concentrated and replacement with MIBK was carried out. Thereafter, 1,000 g of a 2% by mass aqueous oxalic acid solution was charged and the mixture was stirred. After the mixture was left to stand, the aqueous underlayer was removed. This operation was repeated three times to remove the Li salt. Thereafter, 1,000 g of ultrapure water was charged and the mixture was stirred, followed by removing the aqueous underlayer. This operation was repeated three times to remove oxalic acid, and then the solution was concentrated. Subsequently, the concentrate was added dropwise to 500 g of methanol to allow the polymer to be precipitated. The solid was collected on a Buechner funnel. The solid thus obtained was dried under reduced pressure at 60° C. to give 11.5 g of a polymer (b-6) having white color.

The block copolymer (b-6) had the Mw of 11,600, the Mn of 10,400, and the Mw/Mn of 1.12.

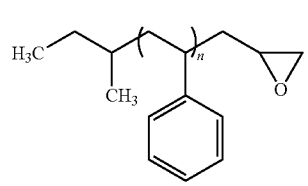

(b-6)

Synthesis Example 1-10: Synthesis of Polymer (b-7)

After a 500-mL flask as a reaction vessel was dried under reduced pressure, 120 g of THF, which had been subjected to a distillation dehydrating treatment, was charged in a nitrogen atmosphere, and cooled to −78° C. Thereafter, 2.38 mL of a 1 N cyclohexane solution of sec-butyllithium (sec-BuLi) (2.30 mmol) was charged into this THF, and then 13.3 mL of styrene (0.115 mol), which had been subjected to adsorptive filtration through silica gel for removing a polymerization inhibitor and to a dehydrating treatment by distillation, was charged by dropwise addition over 30 min. The polymerization system color was ascertained to be orange. During the charging by dropwise addition, the internal temperature of the reaction mixture was carefully controlled so as not to be −60° C. or higher. After completion of the dropwise addition, aging was permitted for 30 min. Subsequently, 0.25 mL of 3-chloromethyl-3-methyloxetane (2.30 mmol) was charged to conduct a terminating reaction of the polymerization end. The temperature of the reaction mixture was elevated to the room temperature, and the resultant reaction mixture was concentrated and replacement with MIBK was carried out. Thereafter, 1,000 g of a 2% by mass aqueous oxalic acid solution was charged and the mixture was stirred. After the mixture was left to stand, the aqueous underlayer was removed. This operation was repeated three times to remove the Li salt. Thereafter, 1,000 g of ultrapure water was charged and the mixture was stirred, followed by removing the aqueous underlayer. This operation was repeated three times to remove oxalic acid, and then the solution was concentrated. Subsequently, the concentrate was added dropwise to 500 g of methanol to allow the polymer to be precipitated. The solid was collected on a Buechner funnel. The solid thus obtained was dried under reduced pressure at 60° C. to give 11.1 g of a block copolymer (b-7) having white color.

The block copolymer (b-7) had the Mw of 5,900, the Mn of 5,300, and the Mw/Mn of 1.11.

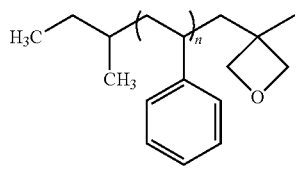

(b-7)

Synthesis Example 1-11: Synthesis of Polymer (b-8)

After a 500-mL flask as a reaction vessel was dried under reduced pressure, 120 g of THF, which had been subjected to a distillation dehydrating treatment, was charged in a nitrogen atmosphere, and cooled to −78° C. Thereafter, 2.38 mL of a 1 N cyclohexane solution of sec-butyllithium (sec-BuLi) (2.30 mmol) was charged into this THF, and then 21.2 mL of 4-t-butylstyrene (0.115 mol), which had been subjected to adsorptive filtration through silica gel for removing a polymerization inhibitor and to a dehydrating treatment by distillation, was charged by dropwise addition over 30 min. The polymerization system color was ascertained to be orange. During the charging by dropwise addition, the internal temperature of the reaction mixture was carefully controlled so as not to be −60° C. or higher. After completion of the dropwise addition, aging was permitted for 30 min. Subsequently, 0.19 mL of epibromohydrin (2.30 mmol) was charged to conduct a terminating reaction of the polymerization end. The temperature of the reaction mixture was elevated to the room temperature, and the resultant reaction mixture was concentrated and replacement with MIBK was carried out. Thereafter, 1,000 g of a 2% by mass aqueous oxalic acid solution was charged and the mixture was stirred. After the mixture was left to stand, the aqueous underlayer was removed. This operation was repeated three times to remove the Li salt. Thereafter, 1,000 g of ultrapure water was charged and the mixture was stirred, followed by removing the aqueous underlayer. This operation was repeated three times to remove oxalic acid, and then the solution was concentrated. Subsequently, the concentrate was added dropwise to 500 g of methanol to allow the polymer to be precipitated. The solid was collected on a Buechner funnel. The solid thus obtained was dried under reduced pressure at 60° C. to give 17.7 g of a polymer (b-8) having white color.

The block copolymer (b-8) had the Mw of 6,000, the Mn of 5,400, and the Mw/Mn of 1.11.

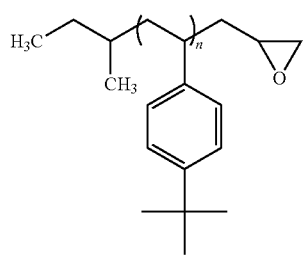

(b-8)

Synthesis of Polymer (C)

Synthesis Example 1-12: Synthesis of Polymer (c-1)

To a 200-mL three-neck flask equipped with a condenser, a dropping funnel and a thermometer were added 40 g of anisole, 16.7 g of styrene (0.160 mol), 3.00 g of methyl methacrylate (0.030 mol), 1.30 g of 2-hydroxyethyl methacrylate (0.01 mol), 0.29 g of copper(II) bromide (2.00 mmol) and 0.46 g of tris[(2-dimethylamino)ethyl]amine (2 mmol), and the mixture was heated to 100° C., and thereto was added 0.53 mL of ethyl 2-bromoisobutyrate (3.6 mmol) and the mixture was heated with stirring under a nitrogen flow for 8 hrs. Thus obtained polymerization reaction mixture was filtered through Celite to remove a copper complex, and washed with 500 g of ultrapure water three times. After the organic layer was collected and then concentrated, 50 g of THF was added to thus resulting concentrate. The mixture was added to 1,000 g of methanol/ultrapure water (mass ratio=5/5) to give a solid purified by precipitation. The solid was collected on a Buechner funnel, and washed with 50 g of methanol. The solid thus obtained was dried under reduced pressure to give 11.2 g of a polymer (c-1) having white color.

The polymer (c-1) had the Mw of 5,600, the Mn of 4,600, and the Mw/Mn of 1.22. In addition, as a result of the $^1$H-NMR analysis, the proportions of the structural units derived from styrene, methyl methacrylate and 2-hydroxyethyl methacrylate were 80 mol %, 15 mol % and 5 mol %, respectively.

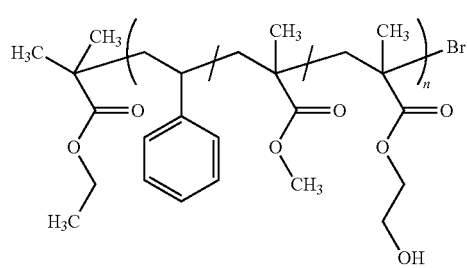

(c-1)

Synthesis Example 1-13: Synthesis of Polymer (c-2)

To a 200-mL three-neck flask equipped with a condenser, a dropping funnel and a thermometer were added 40 g of anisole, 16.7 g of styrene (0.160 mol), 3.00 g of methyl methacrylate (0.030 mol), 0.86 g of methacrylic acid (0.01 mol), 0.29 g of copper(II) bromide (2.00 mmol) and 0.46 g of tris[(2-dimethylamino)ethyl]amine (2 mmol), and the mixture was heated to 100° C., and thereto was added 0.53 mL of ethyl 2-bromoisobutyrate (3.6 mmol) and the mixture was heated with stirring under a nitrogen flow for 8 hrs. Thus obtained polymerization reaction mixture was filtered through Celite to remove a copper complex, and washed with 500 g of ultrapure water three times. After the organic layer was collected and then concentrated, 50 g of THF was added to thus resulting concentrate. The mixture was added to 1,000 g of methanol/ultrapure water (mass ratio: 5/5), thereby giving precipitates of the polymer purified through the precipitation. The white solid was dissolved in 50 g of tetrahydrofuran, and 5 g of a 1 N aqueous hydrochloric acid solution was added thereto. The mixture was heated at 80° C. for 2 hrs with stirring to conduct a hydrolysis reaction. The reaction mixture after the hydrolysis was subjected to purification by precipitation through adding 1,000 g of methanol/ultrapure water (mass ratio: 5/5) to give a solid. The solid was collected on a Buechner funnel, and washed with 50 g of methanol. The solid thus obtained was dried under reduced pressure to give 11.0 g of a polymer (c-2) having white color.

The polymer (c-2) had the Mw of 5,500, the Mn of 4,400, and the Mw/Mn of 1.25. In addition, as a result of the $^1$H-NMR analysis, the proportions of the structural units derived from styrene, methyl methacrylate and methacrylic acid were 80 mol %, 15 mol %, and 5 mol %, respectively.

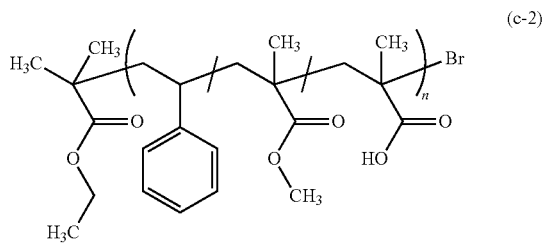

(c-2)

Synthesis Example 1-14: Synthesis of Polymer (c-3)

To a 200-mL three-neck flask equipped with a condenser, a dropping funnel and a thermometer were added 40 g of anisole, 14.6 g of styrene (0.140 mol), 6.00 g of methyl methacrylate (0.060 mol), 0.403 g of 4-cyano-[4-dodecyl (sulfanylthio)carbonylsulfane]pentanoic acid (1 mmol) and 0.164 g of azoisobutyronitrile (1 mmol), and the mixture was heated with stirring at 80° C. for 8 hrs. Thus obtained polymerization reaction mixture was added to 1,000 g of methanol/ultrapure water (mass ratio: 5/5) to give a solid purified by precipitation. The solid was collected on a Buechner funnel, and washed with 50 g of methanol. The solid thus obtained was dried under reduced pressure to give 11.5 g of a polymer (c-3) having yellow color.

The polymer (c-3) had the Mw of 8,400, the Mn of 6,600, and the Mw/Mn of 1.27. In addition, as a result of the $^1$H-NMR analysis, the proportions of the structural units derived from styrene and methyl methacrylate were 70 mol % and 30 mol %, respectively.

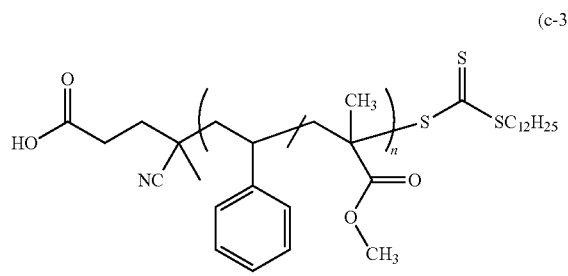

(c-3)

Synthesis Example 1-15: Synthesis of Polymer (c-4)

To a 200-mL three-neck flask equipped with a condenser, a dropping funnel and a thermometer were added 40 g of anisole, 14.6 g of styrene (0.140 mol), 6.00 g of methyl methacrylate (0.006 mol) and 0.417 g of methyl 4-cyano-4-[(dodecylsulfanylthiocarbonyl)sulfanyl]pentanoate (1.00 mmol), and the mixture was heated to 80° C. and stirred for, 8 hrs. Thus obtained polymerization reaction mixture was added to 1,000 g of methanol/ultrapure water (mass ratio: 5/5) to give a solid purified by precipitation. The solid was collected on a Buechner funnel, and washed with 50 g of methanol. Thus obtained polymer having yellow color had the Mw of 8,600, the Mn of 6,500, and the Mw/Mn of 1.32.

Next, thus obtained yellow solid was dissolved in dimethylformamide and the solution was added to 2.80 g of 4,4'-azobis-4-cyanovaleric acid (10 mmol), and the mixture was heated to 80° C. and stirred for 8 hrs. After completion of azo decomposition addition to 1,000 g of methanol/ultrapure water (mass ratio: 5/5) gave a solid purified by precipitation. The solid was collected on a Buechner funnel, and washed with 50 g of methanol. The solid thus obtained was dried under reduced pressure to give 11.0 g of a polymer (c-4) having yellow color.

The polymer (c-4) had the Mw of 8,400, the Mn of 6,200, and the Mw/Mn of 1.35. In addition, as a result of the $^1$H-NMR analysis, the proportions of the structural units derived from styrene and methyl methacrylate were 70 mol % and 30 mol %, respectively.

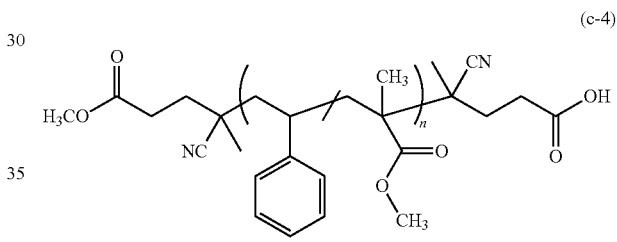

(c-4)

Synthesis Example 1-16: Synthesis of Polymer (c-5)

To a 200-mL three-neck flask equipped with a condenser, a dropping funnel and a thermometer were added 40 g of anisole, 14.6 g of styrene (0.140 mol), 6.00 g (0.060 mol) of methyl methacrylate, 0.29 g of copper(II) bromide (2.00 mmol) and 0.46 g of tris[(2-dimethylamino)ethyl]amine (2.0 mmol), and the mixture was heated to 100° C. To the mixture was added 0.53 g of ethyl 2-bromoisobutyrate (3.6 mmol) with a syringe, and the mixture was heated with stirring for 8 hrs under a nitrogen flow, Thus obtained polymerization reaction mixture was filtered through Celite to remove a copper complex, and washed with 500 g of ultrapure water three times. After the organic layer was collected and then concentrated, 50 g of THF was added to thus resulting concentrate. The mixture was added to 1,000 g of methanol/ultrapure water (mass ratio: 5/5) to give a solid purified by precipitation. The solid was collected on a Buechner funnel, and washed with 50 g of methanol. The solid thus obtained was dried under reduced pressure at drying under reduced pressure to give 11.5 g of a polymer (c-5) having white color.

The polymer (c-5) had the Mw of 6,700, the Mn of 5,800, and the Mw/Mn of 1.16. In addition, as a result of the $^1$H-NMR analysis, the structural units derived from styrene and methyl methacrylate were 70 mol % and 30 mol %, respectively.

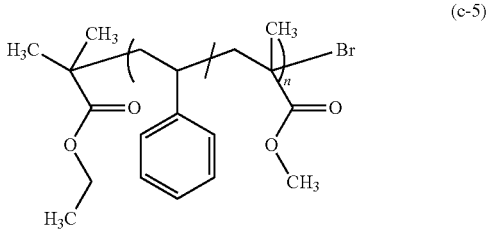

(c-5)

Preparation of Composition

Preparation of Composition (I)

Preparation Example 1-1

A composition (A-1) was prepared by: adding 69 g of propylene glycol monomethyl ether acetate and 29.5 g of ethyl lactate as the solvent (S) to 1.5 g of (a-1) as the polymer (A) synthesized as described above; stirring the mixture; and then filtering the mixture through a high-density polyethylene filter having fine pores of 0.45 μm.

Preparation Examples 1-2 and 1-3

Compositions (A-2) and (A-3) were prepared similarly to Preparation Example 1-1 except that the same mass of (a-2) or (a-3) was used as the polymer (A) in place of the aforementioned (a-1).

Preparation of Composition (II)

Preparation Example 1-4

A composition (B-1) was prepared by: adding 98.8 g of propylene glycol monomethyl ether acetate as the solvent (S) to 1.2 g of (b-1) as the polymer (B) synthesized as described above; permitting dissolution; and then filtering the mixture through a high-density polystyrene filter having fine pores of 0.45 μm.

Preparation Examples 1-5 to 1-11

Compositions (B-2) to (B-8) were prepared similarly to Preparation Example 1-4 except that the same mass of each of (b-2) to (b-8) was used as the polymer (B) in place of the aforementioned (b-1).

Preparation of Composition (III)

Preparation Example 1-12

A composition (C-1) was prepared by: adding 98.8 g of propylene glycol monomethyl ether acetate as the solvent (S) to 1.2 g of (c-1) as the polymer (C) synthesized as described above; permitting dissolution; and then filtering the mixture through a high-density polystyrene filter having fine pores of 0.45 μm.

Preparation Examples 1-13 to 1-16

Compositions (C-2) to (C-5) were prepared similarly to Preparation Example 1-12 except that the same mass of each of (c-2) to (c-5) was used as the polymer (C) in place of the aforementioned (c-1).

Preparation of Composition (IV)

Preparation Example 1-17

A composition (D-1) was prepared by: adding 98.8 g of propylene glycol monomethyl ether acetate as the solvent (S) to 0.6 g of (b-2) as the polymer (B) and 0.6 g of (c-5) as the polymer (C) synthesized as described above; permitting dissolution; and then filtering the mixture through a high-density polystyrene filter having fine pores of 0.45 μm.

Preparation Examples 1-18 to 1-28

Compositions (D-2) to (D-12) were prepared similarly to Preparation Example 1-17 except that each polymer shown in Table 5 below was used.

Preparation of Resist Composition

Synthesis of Polymer

Monomer compounds used in the syntheses of the polymers (a1-1) and (a2-1) are shown below.

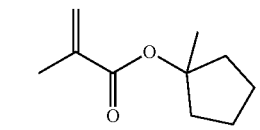

(M-1)

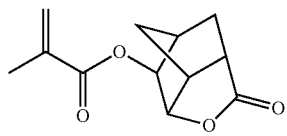

(M-2)

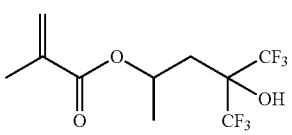

(M-3)

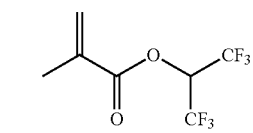

(M-4)

Synthesis Example 1-17: Synthesis of Polymer (a1-1)

In 60 g of methyl ethyl ketone, 12.9 g (50 mol %) of the compound (M-1) and 17.1 g (50 mol %) of the compound (M-2) were dissolved, and 1.77 g of 2,2'-azobisisobutyronitrile (AIBN) was added to the solution to prepare a monomer solution. A three-necked flask (200 mL) charged with 30 g of methyl ethyl ketone was purged with nitrogen for 30 minutes, and heated to 80° C. with stirring. The monomer solution was added dropwise to the flask over 3 hrs using a dropping funnel. The monomers were polymerized for 6 hrs from the start of addition of the monomer solution. After completion of polymerization reaction, the polymer solution was cooled with water to 30° C. or less, and poured into 600 g of methanol. A white powder that precipitated by this operation was filtered off. The white powder was washed twice with each 150 g of methanol in a slurry state, filtered off again, and dried at 50° C. for 17 hrs to give a polymer (a1-1) as white powder (yield: 80%). The polymer (a1-1) had the Mw of 6,900, and the Mw/Mn of 1.35. In addition, as a result of a $^{13}$C-NMR analysis, the proportions of the structural units derived from (M-1) and (M-2) in the polymer (a1-1) were 49 mol % and 51 mol %, respectively.

Synthesis Example 1-18: Synthesis of Polymer (a2-1)

In 60 g of methyl ethyl ketone, 10.4 g (30 mol %) of the compound (M-3) and 19.6 g (70 mol %) of the compound (M-4) were dissolved, and 0.91 g of 2,2'-azobis(isobutyronitrile) was added (5 mol % with respect to the total of the compounds) to the solution to prepare a monomer solution. A three-necked flask (200 mL) charged with 30 g of methyl ethyl ketone was purged with nitrogen for 30 minutes, and heated to 80° C. with stirring. The monomer solution was added dropwise to the flask over 3 hrs using a dropping funnel. The monomers were polymerized for 6 hrs from the start of addition of the monomer solution. After completion of polymerization reaction, the polymer solution was cooled with water to 30° C. or less, and poured into 600 g of methanol. A white powder that precipitated by this operation was filtered off. The white powder was washed twice with 150 g of methanol in a slurry state, filtered off again, and dried at 50° C. for 12 hrs to give a polymer (a2-1) as white powder (yield: 68%). The polymer (a2-1) had the Mw of 5,900, and the Mw/Mn of 1.58. In addition, as a result of a $^{13}$C-NMR analysis, the proportions of the structural units derived from (M-3) and (M-4) in the polymer (a2-1) were 31 mol % and 69 mol %, respectively.

Preparation Example 1-29: Preparation of Resist Composition (J-1)

A resist composition (J-1) was prepared by mixing: 100 parts by mass of the polymer (a1-1) and 3 parts by mass of the polymer (a2-1) synthesized as described above; 10.8 parts by mass of triphenylsulfonium 1,1,2,2-tetrafluoro-6-(1-adamantanecarbonyloxy)hexane-1-sulfonate as the radiation-sensitive acid generator; 4.3 parts by mass of triphenylsulfonium salicylate as an acid diffusion control agent; and 2,185 parts by mass of propylene glycol monomethyl ether acetate, 935 parts by mass of cyclohexanone and 30 parts by mass of γ-butyrolactone as the solvent.

Formation of Base Pattern

Formation of Base Pattern (1)

An underlayer film having an average thickness of 85 nm was formed on a bare-Si substrate by using a composition for underlayer film formation (JSR Corporation, "HM710"), and on this underlayer film, an SOG film having an average thickness of 30 nm was formed by using an SOG composition (JSR Corporation, "ISX302"). The substrate thus obtained was spin-coated at 1,500 rpm with the composition (III) (any of compositions (C-1) to (C-5)) shown in Table 1 below, and baked at 220° C. for 60 sec. The baked substrate was rinsed with propylene glycol monomethyl ether acetate (PGMEA) for 4 sec to remove unreacted materials, etc. Subsequently, the resist composition (J-1) prepared as described above was applied on the substrate from which the unreacted materials, etc., were removed to provide a resist film having a thickness of 85 nm. By carrying out ArF liquid immersion lithography followed by a development with butyl acetate, a resist hole pattern having a hole size of 60 nm and a pitch of 150 nm was formed.

The resist hole pattern thus obtained was spin-coated at 1,500 rpm with the composition (II) (any of compositions (B-1) to (B-8)) shown in Table 1 below, and baked at 220° C. for 60 sec. The baked substrate was rinsed with propylene glycol monomethyl ether acetate (PGMEA) for 4 sec to remove unreacted materials, etc., whereby base patterns (P-1) to (P-12) were formed.

The base pattern (P-13) was formed as in the aforementioned Formation of Base Pattern (1) by using the composition (B-2) as the composition (III), and the composition (C-1) as the composition (II).

The base pattern (P-14) was formed as in the aforementioned Formation of Base Pattern (1) by using the composition (B-2) as both the composition (III) and the composition (II).

The base pattern (P-15) was formed as in the aforementioned Formation of Base Pattern (1) by using the composition (C-1) as both the composition (III) and the composition (II).

The base pattern (P-16) was formed as in the aforementioned Formation of Base Pattern (1), without applying the composition (III) and the composition (II). In Table 1, "-" indicates that the applying of the composition (II) and (III) was not carried out.

Evaluations

With respect to the base patterns (P-1) to (P-16) obtained, the static contact angles (unit: °) of bottom faces and lateral faces with water in the recessed portions, and the average thickness (unit: nm) of the coating film were measured with a contact angle meter (KRUSS GmbH, "DSA-10") and a high-speed spectroscopic ellipsometer (J. A. Woollam Japan Corp., "M2000"), by way of alternative evaluations, using coating films each having a surface condition to corresponding base pattern. The results of the evaluation are shown together in Table 1 below.

TABLE 1

| | | | Bottom face | | Lateral face | |
|---|---|---|---|---|---|---|
| Base pattern | Composition (II) | Composition (III) | static contact angle (°) | average thickness of coating film (nm) | static contact angle (°) | average thickness of coating film (nm) |
| P-1 | B-2 | C-1 | 78 | 2.3 | 89 | 2.6 |
| P-2 | B-3 | C-1 | 78 | 2.3 | 90 | 2.8 |
| P-3 | B-4 | C-1 | 78 | 2.3 | 90 | 2.8 |
| P-4 | B-5 | C-1 | 78 | 2.3 | 90 | 2.7 |
| P-5 | B-6 | C-1 | 78 | 2.3 | 90 | 2.8 |
| P-6 | B-7 | C-1 | 78 | 2.3 | 89 | 2.6 |
| P-7 | B-8 | C-1 | 78 | 2.3 | 100 | 2.9 |
| P-8 | B-4 | C-2 | 80 | 2.5 | 90 | 2.8 |
| P-9 | B-4 | C-3 | 79 | 2.5 | 90 | 2.8 |
| P-10 | B-4 | C-4 | 78 | 2.2 | 90 | 2.8 |
| P-11 | B-4 | C-5 | 79 | 2.1 | 90 | 2.8 |
| P-12 | B-1 | C-1 | 78 | 2.3 | 55 | 0.5 |
| P-13 | C-1 | B-2 | 77 | 1.9 | 75 | 1.2 |
| P-14 | B-2 | B-2 | 65 | 0.5 | 89 | 2.6 |
| P-15 | C-1 | C-1 | 78 | 2.3 | 75 | 1.2 |
| P-16 | — | — | 62 | 0 | 45 | 0 |

Formation of Base Pattern (2)

An underlayer film having an average thickness of 85 nm was formed on a bare-Si substrate by using a composition for underlayer film formation (JSR Corporation, "HM710"), and on this underlayer film, an SOG film having an average thickness of 30 nm was formed by using an SOG composition (JSR Corporation, "ISX302"). The substrate thus obtained was spin-coated at 1,500 rpm with the composition (III) (composition (C-1) or (C-2)) shown in Table 2 below, and baked at 220° C. for 60 sec. The baked substrate was rinsed with PGMEA for 4 sec to remove unreacted materials, etc. Subsequently, a resist composition (JSR Corporation, "AIM5484JN") was applied on the substrate from which the unreacted materials, etc., were removed to provide a resist film having a thickness of 85 nm. By carrying out ArF liquid immersion lithography followed by a development with a 2.38% by mass aqueous tetrabutylammonium hydroxide solution and baking at 180° C., a resist hole pattern having a hole size of 60 nm and a pitch of 150 nm was formed.

The resist hole pattern thus obtained was spin-coated at 1,500 rpm with the composition (II) (composition (B-4)) shown in Table 2 below, and baked at 220° C. for 60 sec. The baked substrate was rinsed with PGMEA for 4 sec to remove unreacted materials, etc., whereby base patterns (P-17) and (P-18) were formed.

With respect to the base patterns (P-17) and (P-18) formed as described above, the static contact angles of bottom faces and lateral faces with water in the recessed portions, and the average thickness of the coating film were measured according to the methods similar to those described above. The results of the evaluation are shown together in Table 2 below.

TABLE 2

| Base pattern | Composition (II) | Composition (III) | Bottom face static contact angle (°) | Bottom face average thickness of coating film (nm) | Lateral face static contact angle (°) | Lateral face average thickness of coating film (nm) |
|---|---|---|---|---|---|---|
| P-17 | B-4 | C-1 | 78 | 2.3 | 90 | 2.8 |
| P-18 | B-4 | C-2 | 80 | 2.5 | 90 | 2.8 |

Formation of Base Pattern (3)

An underlayer film having an average thickness of 85 nm was formed on a bare-Si substrate by using a composition for underlayer film formation (JSR Corporation, "HM710"), and on this underlayer film, an SOG film having an average thickness of 30 nm was formed by using an SOG composition (JSR Corporation, "ISX302"). The substrate thus obtained was spin-coated at 1,500 rpm with the composition (III) (composition (C-1)) shown in Table 3 below, and baked at 220° C. for 60 sec. The baked substrate was rinsed with PGMEA for 4 sec to remove unreacted materials, etc. Subsequently, a resist composition (JSR Corporation, "AIM5484JN") was applied on the substrate from which the unreacted materials, etc., were removed to provide a resist film having an average thickness of 85 nm. By carrying out ArF liquid immersion lithography followed by a development with a 2.38% by mass aqueous tetrabutylammonium hydroxide solution and an ArF overall-exposure, a resist hole pattern having a hole size of 60 nm and a pitch of 150 nm was formed.

The resist hole pattern thus obtained was spin-coated at 1,500 rpm with the composition (II) (composition (B-4)) shown in Table 3 below, and baked at 220° C. for 60 sec. The baked substrate was rinsed with PGMEA for 4 sec to remove unreacted materials, etc., whereby base patterns (P-19) and (P-20) were formed.

With respect to the base patterns (P-19) and (P-20) formed as described above, the static contact angles of bottom faces and lateral faces with water in the recessed portions, and the average thickness of the coating film were measured according to the methods similar to those described above. The results of the evaluation are shown together in Table 3 below.

TABLE 3

| Base pattern | Composition (II) | Composition (III) | Bottom face static contact angle (°) | Bottom face average thickness of coating film (nm) | Lateral face static contact angle (°) | Lateral face average thickness of coating film (nm) |
|---|---|---|---|---|---|---|
| P-19 | B-4 | C-1 | 79 | 2.3 | 89 | 2.9 |
| P-20 | B-4 | C-2 | 80 | 2.2 | 90 | 2.8 |

Formation of Base Pattern (4)

An underlayer film having an average thickness of 85 nm was formed on a bare-Si substrate by using a composition for underlayer film formation (JSR Corporation, "HM710"), and on this underlayer film, an SOG film having an average thickness of 30 nm was formed by using an SOG composition (JSR Corporation, "ISX302"). On the substrate thus obtained, the resist composition (J-1) prepared as described above was applied to provide a resist film having an average thickness of 85 nm. By carrying out ArF liquid immersion lithography followed by a development with butyl acetate, a resist hole pattern having a hole size of 60 nm and a pitch of 150 nm was formed.

The resist hole pattern thus obtained was spin-coated at 1,500 rpm with the composition (II) (any of compositions ((B-1) to (B-8)) shown in Table 4 below, and baked at 220° C. for 60 sec. The baked substrate was rinsed with PGMEA for 4 sec to remove unreacted materials, etc. Subsequently, spin-coating with the composition (III) (any of compositions (C-1) to (C-5)) shown in Table 4 below was conducted at 1,500 rpm, and baking was carried out at 220° C. for 60 sec. The baked substrate was rinsed with PGMEA for 4 sec to remove unreacted materials, etc., whereby base patterns (P-21) to (P-32) were formed.

The base pattern (P-33) was formed as in the Formation of Base Pattern (4), by using the composition (C-1) as the composition (II), and the composition (B-2) as the composition (III).

With respect to the base patterns (P-21) to (P-33) formed as described above, the static contact angles of bottom faces and lateral faces with water in the recessed portions, and the average thickness of the coating film were measured according to the methods similar to those described above. The results of the evaluation are shown together in Table 4 below.

TABLE 4

| Base pattern | Compo-sition (II) | Compo-sition (III) | Bottom face static contact angle (°) | Bottom face average thickness of coating film (nm) | Lateral face static contact angle (°) | Lateral face average thickness of coating film (nm) |
|---|---|---|---|---|---|---|
| P-21 | B-2 | C-1 | 78 | 2.3 | 89 | 2.6 |
| P-22 | B-2 | C-2 | 80 | 2.5 | 89 | 2.6 |
| P-23 | B-2 | C-3 | 79 | 2.2 | 89 | 2.6 |
| P-24 | B-2 | C-4 | 78 | 2.2 | 89 | 2.6 |
| P-25 | B-2 | C-5 | 79 | 2.1 | 89 | 2.6 |
| P-26 | B-3 | C-1 | 78 | 2.3 | 90 | 2.8 |
| P-27 | B-4 | C-1 | 78 | 2.3 | 90 | 2.8 |
| P-28 | B-5 | C-1 | 78 | 2.3 | 90 | 2.7 |
| P-29 | B-6 | C-1 | 78 | 2.3 | 90 | 2.8 |
| P-30 | B-7 | C-1 | 78 | 2.3 | 89 | 2.6 |
| P-31 | B-8 | C-1 | 78 | 2.3 | 100 | 2.9 |
| P-32 | B-1 | C-1 | 78 | 2.3 | 55 | 0.5 |
| P-33 | C-1 | B-2 | 78 | 2.3 | 83 | 2.2 |

Formation of Base Pattern (5)

An underlayer film having an average thickness of 85 nm was formed on a bare-Si substrate by using a composition for underlayer film formation (JSR Corporation, "HM710"), and on this underlayer film, an SOG film having an average thickness of 30 nm was formed by using an SOG composition (JSR Corporation, "ISX302"). On the substrate thus obtained, the resist composition (J-1) prepared as described above was applied to provide a resist film having an average thickness of 85 nm. By carrying out ArF liquid immersion lithography followed by a development with butyl acetate, a resist hole pattern having a hole size of 60 nm and a pitch of 150 nm was formed.

The resist hole pattern thus obtained was spin-coated at 1,500 rpm with the composition (IV) (any of compositions (D-1) to (D-12)) shown in Table 5 below, and baked at 220° C. for 60 sec. The baked substrate was rinsed with PGMEA for 4 sec to remove unreacted materials, etc., whereby base patterns (P-34) to (P-45) were formed.

The base pattern (P-46) was formed as in the Formation of Base Pattern (5), by using the composition (B-2) as the composition (IV).

The base pattern (P-47) was formed as in the Formation of Base Pattern (5), by using the composition (C-1) as the composition (IV).

In Table 5, "—" indicates that the composition used did not contain both the polymer (B) and the polymer (C).

With respect to the base patterns (P-34) to (P-47) formed as described above, the static contact angles of bottom faces and lateral faces with water in the recessed portions, and the average thickness of the coating film were measured according to the methods similar to those described above. The results of the evaluation are shown together in Table 5 below.

TABLE 5

| Base pattern | Compo-sition (IV) | (B) Poly-mer | (C) Poly-mer | Bottom face static contact angle (°) | Bottom face average thickness of coating film (nm) | Lateral face static contact angle (°) | Lateral face average thickness of coating film (nm) |
|---|---|---|---|---|---|---|---|
| P-34 | D-1 | b-2 | c-5 | 80 | 2.2 | 88 | 2.7 |
| P-35 | D-2 | b-3 | c-1 | 79 | 2.2 | 89 | 2.7 |
| P-36 | D-3 | b-3 | c-5 | 80 | 2.3 | 89 | 2.8 |
| P-37 | D-4 | b-4 | c-1 | 79 | 2.4 | 89 | 2.6 |
| P-38 | D-5 | b-4 | c-2 | 82 | 2.2 | 89 | 2.7 |
| P-39 | D-6 | b-4 | c-5 | 79 | 2.2 | 89 | 2.6 |
| P-40 | D-7 | b-7 | c-1 | 79 | 2.3 | 88 | 2.6 |
| P-41 | D-8 | b-7 | c-2 | 82 | 2.2 | 88 | 2.9 |
| P-42 | D-9 | b-7 | c-5 | 79 | 2.1 | 88 | 2.8 |
| P-43 | D-10 | b-8 | c-1 | 79 | 2.2 | 98 | 2.9 |
| P-44 | D-11 | b-8 | c-2 | 82 | 2.2 | 98 | 2.6 |
| P-45 | D-12 | b-8 | c-5 | 79 | 2.1 | 98 | 2.6 |
| P-46 | B-2 | — | — | 65 | 0.5 | 89 | 2.6 |
| P-47 | C-1 | — | — | 78 | 2.3 | 75 | 1.2 |

Formation of Miniaturized Pattern

Examples 1-1 to 1-54 and Comparative Examples 1-1 to 1-5

By using each of the base patterns (P-1) to (P-47) formed as described above, a miniaturized contact hole pattern was formed according to the following procedure through carrying out the filling step, the phase separation step and the removing step.

Filling Step and Phase Separation Step

The compositions (I) (compositions (A-1) to (A-3)) prepared were each applied on the formed base patterns (P-1) to (P-47) by spin coating at 1,500 rpm. This substrate was subjected to heat annealing under nitrogen at 220° C. for 60 sec thereby permitting phase separation.

Removing Step

The substrate after the phase separation step was irradiated with a radioactive ray of 172 nm at an intensity of 300 mJ/cm$^2$, and immersed in a mixed liquid of methyl isobutyl ketone (MIBK)/2-propanol (IPA) (2/8 (mass ratio)) for 5 min. Accordingly, the phase constituted with the poly (methyl methacrylate) block in the polymers (A-1) to (A-3) was dissolved to be removed, whereby a miniaturized contact hole pattern was formed.

Evaluations

An image of the miniaturized contact hole pattern formed as described above was acquired by using a scanning electron microscope (Hitachi High-Technologies Corporation, "CG4000") at a high magnification (300 K), and a periodic analysis was performed by using a calculation tool (Hitachi High-Technologies Corporation) to evaluate the average diameter (unit: nm) and the placement error (x direction and y direction, unit: nm) of the contact hole pattern.

The placement error (x direction, y direction) may be evaluated to be: "favorable" in the case of being no greater than 3.5 nm; and "unfavorable" in the case of being greater than 3.5 nm.

In addition, the substrate after the development was spin-coated at 1,500 rpm with a photosensitive SOG composition (JSR Corporation, "DS492Y"), and thereafter soft-baked at 80° C. for 30 sec. The substrate was then irradiated with a KrF exposure device at 200 mJ/cm$^2$, and subsequently permitted a sol-gel hardening reaction at 80° C. for 120 sec. In such a state of the miniaturized contact hole pattern being thus filled, the average thickness (unit: nm) of residues at the bottom was measured by a cross-section SEM inspection using a line-width measurement SEM.

The results of the evaluations of the average diameter, the placement error, and the average thickness of residues at the bottom on the miniaturized contact hole pattern are shown together in Table 6 below.

TABLE 6

| | Base pattern | Composition (I) | Average diameter of holes (nm) | Placement error (nm) x direction | Placement error (nm) y direction | Average thickness of residues at bottom (nm) |
|---|---|---|---|---|---|---|
| Example 1-1 | P-1 | A-1 | 24.1 | 2.3 | 2.2 | 9.8 |
| Example 1-2 | P-2 | A-1 | 24.3 | 2.3 | 2.2 | 8.7 |
| Example 1-3 | P-3 | A-1 | 24.0 | 2.4 | 2.5 | 10.0 |
| Example 1-4 | P-4 | A-1 | 24.2 | 2.2 | 2.3 | 9.9 |
| Example 1-5 | P-5 | A-1 | 24.8 | 2.2 | 2.1 | 8.6 |
| Example 1-6 | P-6 | A-1 | 24.2 | 2.3 | 2.3 | 9.7 |
| Example 1-7 | P-7 | A-1 | 24.4 | 2.4 | 2.2 | 8.7 |
| Example 1-8 | P-8 | A-1 | 24.4 | 2.4 | 2.4 | 8.8 |
| Example 1-9 | P-9 | A-1 | 24.1 | 2.2 | 2.2 | 9.5 |
| Example 1-10 | P-10 | A-1 | 24.4 | 2.3 | 2.3 | 9.0 |
| Example 1-11 | P-11 | A-1 | 24.5 | 2.2 | 2.3 | 10.3 |
| Example 1-12 | P-12 | A-1 | 24.9 | 2.8 | 2.9 | 16.7 |
| Example 1-13 | P-13 | A-1 | 24.9 | 3.0 | 2.9 | 17.1 |
| Comparative Example 1-1 | P-14 | A-1 | 24.8 | 3.8 | 3.7 | 22.2 |
| Comparative Example 1-2 | P-15 | A-1 | 24.8 | 3.9 | 3.7 | 17.0 |
| Comparative Example 1-3 | P-16 | A-1 | 24.9 | 4.2 | 4.2 | 24.0 |
| Example 1-14 | P-17 | A-1 | 24.3 | 2.4 | 2.3 | 9.6 |
| Example 1-15 | P-18 | A-1 | 24.3 | 2.1 | 2.4 | 8.7 |
| Example 1-16 | P-19 | A-1 | 24.3 | 2.2 | 2.2 | 8.7 |
| Example 1-17 | P-20 | A-1 | 24.2 | 2.2 | 2.2 | 7.9 |
| Example 1-18 | P-21 | A-1 | 24.5 | 2.2 | 2.3 | 8.9 |
| Example 1-19 | P-22 | A-1 | 24.3 | 2.2 | 2.1 | 9.2 |
| Example 1-20 | P-23 | A-1 | 24.4 | 2.1 | 2.1 | 9.0 |
| Example 1-21 | P-24 | A-1 | 24.4 | 2.4 | 2.3 | 10.3 |
| Example 1-22 | P-25 | A-1 | 24.1 | 2.3 | 2.2 | 10.2 |
| Example 1-23 | P-26 | A-1 | 24.3 | 2.3 | 2.2 | 8.5 |
| Example 1-24 | P-27 | A-1 | 24.5 | 2.1 | 2.4 | 8.0 |
| Example 1-25 | P-28 | A-1 | 24.7 | 2.4 | 2.4 | 8.8 |
| Example 1-27 | P-30 | A-1 | 24.3 | 2.1 | 2.3 | 9.8 |
| Example 1-28 | P-31 | A-1 | 24.6 | 2.3 | 2.1 | 10.0 |
| Example 1-29 | P-32 | A-1 | 24.7 | 3.4 | 3.4 | 24.3 |
| Example 1-30 | P-33 | A-1 | 24.8 | 2.7 | 2.8 | 16.8 |
| Example 1-31 | P-34 | A-1 | 24.8 | 2.3 | 2.4 | 10.3 |
| Example 1-32 | P-35 | A-1 | 24.4 | 2.3 | 2.3 | 9.5 |
| Example 1-33 | P-36 | A-1 | 24.5 | 2.4 | 2.1 | 9.2 |
| Example 1-34 | P-37 | A-1 | 24.4 | 2.2 | 2.2 | 8.3 |
| Example 1-35 | P-38 | A-1 | 24.4 | 2.2 | 2.2 | 8.5 |
| Example 1-36 | P-39 | A-1 | 24.4 | 2.2 | 2.0 | 9.5 |
| Example 1-37 | P-40 | A-1 | 24.2 | 2.3 | 2.1 | 9.5 |
| Example 1-38 | P-41 | A-1 | 24.3 | 2.3 | 2.5 | 8.7 |
| Example 1-39 | P-42 | A-1 | 24.3 | 2.4 | 2.3 | 8.6 |
| Example 1-40 | P-43 | A-1 | 24.6 | 2.2 | 2.3 | 9.6 |
| Example 1-41 | P-44 | A-1 | 24.3 | 2.5 | 2.3 | 10.2 |
| Example 1-42 | P-45 | A-1 | 24.5 | 2.4 | 2.4 | 9.6 |
| Comparative Example 1-4 | P-46 | A-1 | 24.8 | 3.6 | 3.4 | 16.0 |
| Comparative Example 1-5 | P-47 | A-1 | 24.9 | 3.9 | 4.1 | 23.0 |
| Example 1-43 | P-8 | A-2 | 24.3 | 2.2 | 2.3 | 8.1 |
| Example 1-44 | P-11 | A-2 | 24.3 | 2.2 | 2.1 | 8.2 |
| Example 1-45 | P-14 | A-2 | 24.6 | 2.1 | 2.1 | 8.2 |
| Example 1-46 | P-16 | A-2 | 24.5 | 2.2 | 2.1 | 7.4 |
| Example 1-47 | P-23 | A-2 | 24.2 | 2.1 | 2.3 | 7.2 |
| Example 1-48 | P-33 | A-2 | 24.7 | 2.1 | 2.2 | 7.8 |
| Example 1-49 | P-8 | A-3 | 20.9 | 2.4 | 2.3 | 9.3 |
| Example 1-50 | P-11 | A-3 | 21.1 | 2.3 | 2.5 | 9.1 |
| Example 1-51 | P-14 | A-3 | 21.0 | 2.4 | 2.4 | 9.5 |

TABLE 6-continued

| | Base pattern | Composition (I) | Average diameter of holes (nm) | Placement error (nm) x direction | Placement error (nm) y direction | Average thickness of residues at bottom (nm) |
|---|---|---|---|---|---|---|
| Example 1-52 | P-16 | A-3 | 21.3 | 2.4 | 2.3 | 9.2 |
| Example 1-53 | P-23 | A-3 | 20.8 | 2.4 | 2.3 | 9.2 |
| Example 1-54 | P-33 | A-3 | 21.0 | 2.4 | 2.4 | 9.5 |

As is seen from the results shown in Table 6, the pattern-forming method (A) enables a hole pattern to be formed with inhibited placement errors and with reduced residues at the bottom, even in the case of the hole diameter being small.

Pattern-Forming Method (B)

Synthesis of Polymer (A')

Synthesis Example 2-1: Synthesis of Polymer (A-1)

After a 500-mL flask as a reaction vessel was dried under reduced pressure, 120 g of tetrahydrofuran (THF), which had been subjected to a distillation dehydrating treatment, was charged in a nitrogen atmosphere, and cooled to −78° C. Thereafter, 3.10 mL of a 1 N cyclohexane solution of sec-butyllithium (sec-BuLi) (3.00 mmol) was charged into this THF, and then 16.6 mL of styrene (0.150 mol), which had been subjected to adsorptive filtration through silica gel for removing a polymerization inhibitor and to a dehydrating treatment by distillation, was charged by dropwise addition over 30 min. The polymerization system color was ascertained to be orange. During the charging by dropwise addition, the internal temperature of the polymerization reaction mixture was carefully controlled so as not to be −60° C. or higher. After completion of the dropwise addition, aging was permitted for 30 min. Subsequently, a mixture of 0.63 mL of 2-ethylhexyl glycidyl ether (3.00 mmol) and 1 mL of methanol as a chain-end terminator was charged to conduct a terminating reaction of the polymerization end. The temperature of the polymerization reaction mixture was elevated to the room temperature, and after concentration of the mixture, replacement with methyl isobutyl ketone (MIBK) was carried out. Thereafter, 1,000 g of a 2% by mass aqueous oxalic acid solution was charged and the mixture was stirred. After the mixture was left to stand, the aqueous underlayer was removed. This operation was repeated three times to remove the Li salt. Thereafter, 1,000 g of ultrapure water was charged and the mixture was stirred, followed by removing the aqueous underlayer. This operation was repeated three times to remove oxalic acid, and then the resultant solution was concentrated. Subsequently, the concentrate was added dropwise to 500 g of methanol to allow the polymer to be precipitated. The solid was collected on a Buechner funnel. Thus obtained polymer was dried under reduced pressure at 60° C. to give 14.8 g of a polymer represented by the following formula (A-1) as white solid. The polymer (A-1) had the Mw of 6,100, the Mn of 5,700, and the Mw/Mn of 1.07.

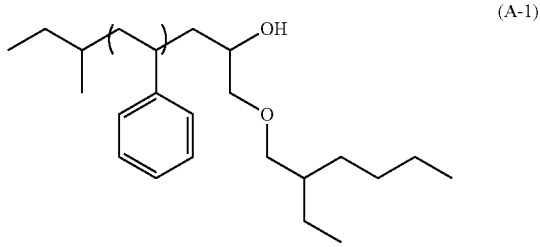

(A-1)

Synthesis Example 2-2: Synthesis of Polymer (A-2)

After a 500-mL flask as a reaction vessel was dried under reduced pressure, 120 g of tetrahydrofuran, which had been subjected to a distillation dehydrating treatment, was charged in a nitrogen atmosphere, and cooled to −78° C. Thereafter, 3.10 mL of a 1 N cyclohexane solution of sec-BuLi (3.00 mmol) was charged into this tetrahydrofuran, and then 16.6 mL of styrene (0.150 mol), which had been subjected to adsorptive filtration through silica gel for removing a polymerization inhibitor and to a dehydrating treatment by distillation, was charged by dropwise addition over 30 min. The polymerization system color was ascertained to be orange. During the charging by dropwise addition, the internal temperature of the polymerization reaction mixture was carefully controlled so as not to be −60° C. or higher. After completion of the dropwise addition, aging was permitted for 30 min. Subsequently, a mixture of 0.27 mL of methyl glycidyl ether (3.00 mmol) and 1 mL of methanol as a chain-end terminator was charged to conduct a terminating reaction of the polymerization end. The temperature of the polymerization reaction mixture was elevated to the room temperature, and after concentration of the mixture, replacement with MIBK was carried out. Thereafter, 1,000 g of a 2% by mass aqueous oxalic acid solution was charged and the mixture was stirred. After the mixture was left to stand, the aqueous underlayer was removed. This operation was repeated three times to remove the Li salt. Thereafter, 1,000 g of ultrapure water was charged and the mixture was stirred, followed by removing the aqueous underlayer. This operation was repeated three times to remove oxalic acid, and then the solution was concentrated. Subsequently, the concentrate was added dropwise to 500 g of methanol to allow the polymer to be precipitated. The solid was collected on a Buechner funnel. Thus obtained polymer was dried under reduced pressure at 60° C. to give 14.6 g of a polymer represented by the following formula (A-2) as white solid. The polymer (A-2) had the Mw of 6,100, the Mn of 5,600, and the Mw/Mn of 1.09.

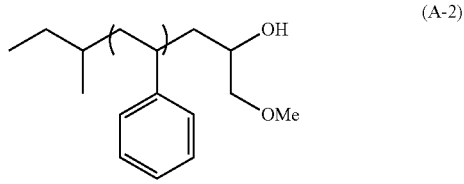

(A-2)

Synthesis Example 2-3: Synthesis of Polymer (A-3)

After a 500-mL flask as a reaction vessel was dried under reduced pressure, 110 g of tetrahydrofuran, which had been subjected to a distillation dehydrating treatment, was charged in a nitrogen atmosphere, and cooled to −78° C. Thereafter, 3.43 mL of a 1 N cyclohexane solution of sec-BuLi (3.33 mmol) was charged into this tetrahydrofuran, and then 16.6 mL of styrene (0.150 mol), which had been subjected to adsorptive filtration through silica gel for removing a polymerization inhibitor and to a dehydrating treatment by distillation, was charged by dropwise addition over 30 min. The polymerization system color was ascertained to be orange. During the charging by dropwise addition, the internal temperature of the polymerization reaction mixture was carefully controlled so as not to be −60° C. or higher. After completion of the dropwise addition, aging was permitted for 30 min. Subsequently, 0.27 mL of 3-bromopropionitrile (3.33 mmol) as a chain-end terminator was charged to conduct a terminating reaction of the polymerization end. The temperature of the polymerization reaction mixture was elevated to the room temperature, and after concentration of the mixture, replacement with MIBK was carried out. Thereafter, 1,000 g of a 2% by mass aqueous oxalic acid solution was charged and the mixture was stirred. After the mixture was left to stand, the aqueous underlayer was removed. This operation was repeated three times to remove the Li salt. Thereafter, 1,000 g of ultrapure water was charged and the mixture was stirred, followed by removing the aqueous underlayer. This operation was repeated three times to remove oxalic acid, and then the solution was concentrated. Subsequently, the concentrate was added dropwise to 500 g of methanol to allow the polymer to be precipitated. The solid was collected on a Buechner funnel. Thus obtained polymer was dried under reduced pressure at 60° C. to give 14.8 g of a polymer represented by the following formula (A-3) having white color. The polymer (A-3) had the Mw of 5,600, the Mn of 4,900, and the Mw/Mn of 1.14.

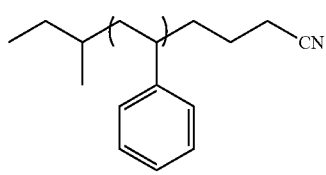

(A-3)

Synthesis Example 2-4: Synthesis of Polymer (A-4)

After a 500-mL flask as a reaction vessel was dried under reduced pressure, 120 g of tetrahydrofuran, which had been subjected to a distillation dehydrating treatment, was charged in a nitrogen atmosphere, and cooled to −78° C. Thereafter, 3.43 mL of a 1 N cyclohexane solution of sec-BuLi (3.33 mmol) was charged into this tetrahydrofuran, and then 16.6 mL of styrene (0.150 mol), which had been subjected to adsorptive filtration through silica gel for removing a polymerization inhibitor and to a dehydrating treatment by distillation, was charged by dropwise addition over 30 min. The polymerization system color was ascertained to be orange. During the charging by dropwise addition, the internal temperature of the polymerization reaction mixture was carefully controlled so as not to be −60° C. or higher. After completion of the dropwise addition, aging was permitted for 30 min. Subsequently, a mixture of an excess amount, 0.54 mL (6.66 mmol), of epibromohydrin and 1 mL of methanol as a chain-end terminator was charged to conduct a terminating reaction of the polymerization end. The temperature of the polymerization reaction mixture was elevated to the room temperature, and after concentration of the mixture, replacement with MIBK was carried out. Thereafter, 500 g of a 0.2% by mass aqueous oxalic acid solution was charged and the mixture was stirred. After the mixture was left to stand, the aqueous underlayer was removed. This operation was repeated three times to remove the Li salt. Thereafter, 500 g of ultrapure water was charged and the mixture was stirred, followed by removing the aqueous underlayer. This operation was repeated three times to remove oxalic acid, and then the solution was concentrated. Subsequently, the concentrate was added dropwise to 500 g of methanol to allow the polymer to be precipitated. The solid was collected on a Buechner funnel. Thus obtained polymer was dried under reduced pressure at 60° C. to give 14.6 g of a polymer represented by the following formula (A-4) having white color. The polymer (A-4) had the Mw of 5,500, the Mn of 5,100, and the Mw/Mn of 1.08.

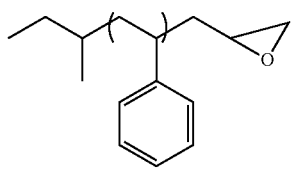

(A-4)

Synthesis Example 2-5: Synthesis of Polymer (A-5)

To a 200 mL three-neck flask equipped with a condenser, a dropping funnel and a thermometer were added 10 g of toluene, 5.60 g of styrene (54 mmol), 4.40 g of methyl methacrylate (43 mmol), 0.039 g of azoisobutyronitrile (AIBN) (0.24 mmol) and 0.088 g of 2-methyl-2-[(dodecyl sulfanylthiocarbonyl)sulfanyl]propanoic acid (0.24 mmol), and the mixture was heated with stirring under a nitrogen flow at 60° C. for 4 hrs. Thus obtained polymerization reaction mixture was subjected to purification by precipitation in 100 g of methanol to allow the polymer to be precipitated. The solid was collected on a Buechner funnel, and washed twice with 20 g of methanol to remove the component derived from the initiator. Drying under reduced pressure gave 2.5 g of a polymer represented by the following formula (A-5) as white solid. The polymer (A-5) had the Mn of 5,200, and the Mw/Mn of 1.17. In addition, as a result of the $^1$H-NMR analysis, the proportions of the structural unit derived from styrene and the structural unit derived from methyl methacrylate were 49 mol % and 51 mol %, respectively.

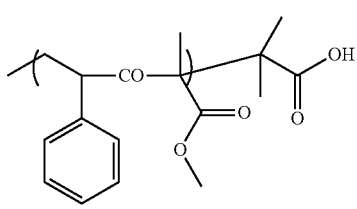

(A-5)

Synthesis Example 2-6: Synthesis of Polymer (A-a)

After a 500-mL flask as a reaction vessel was dried under reduced pressure, 200 g of THF, which had been subjected to a distillation dehydrating treatment, was charged in a nitrogen atmosphere, and cooled to −78° C. Thereafter, 0.30 mL of a 1 N cyclohexane solution of sec-BuLi (0.27 mmol) was charged into this THF, and then 17.7 mL of styrene (0.154 mol), which had been subjected to adsorptive filtration through silica gel for removing a polymerization inhibitor and to a dehydrating treatment by distillation, was charged by dropwise addition over 30 min. The polymerization system color was ascertained to be orange. During the charging by dropwise addition, the internal temperature of the polymerization reaction mixture was carefully controlled so as not to be −60° C. or higher. After completion of the dropwise addition, aging was permitted for 30 min. Subsequently, 0.11 mL of 1,1-diphenylethylene (0.00081 mol) and 1.08 mL of a 0.5 N THF solution of lithium chloride (0.0005 mol) were added to the mixture, and the polymerization system color was ascertained to be dark red. Furthermore, 10.0 mL of methyl methacrylate (0.094 mol), which had been subjected to adsorptive filtration through silica gel for removing a polymerization inhibitor and to a dehydrating treatment by distillation, was charged by dropwise addition to the polymerization reaction mixture over 30 min. The polymerization system color was ascertained to be light yellow, and thereafter the reaction was allowed to proceed for 120 min. Subsequently, 1 mL of methanol as a chain-end terminator was charged to conduct a terminating reaction of the polymerization end. The temperature of the polymerization reaction mixture was elevated to the room temperature, and after concentration of the mixture, replacement with MIBK was carried out. Thereafter, 1,000 g of a 2% by mass aqueous oxalic acid solution was charged and the mixture was stirred. After the mixture was left to stand, the aqueous underlayer was removed. This operation was repeated three times to remove the Li salt. Thereafter, 1,000 g of ultrapure water was charged and the mixture was stirred, followed by removing the aqueous underlayer. This operation was repeated three times to remove oxalic acid, and then the solution was concentrated. Subsequently, the concentrate was added dropwise to 500 g of methanol to allow the polymer to be precipitated. The solid was collected on a Buechner funnel. Next, in order to remove the polystyrene homopolymer, 500 g of heptane was poured to the solid, whereby the polymer was washed, and the polystyrene homopolymer was dissolved into heptane. This operation was repeated four times, and again the solid was collected on a Buechner funnel. Thus obtained polymer was dried under reduced pressure at 60° C. to give 24.1 g of a polymer (A-a) represented by the following formula (A-a) having white color. The polymer (A-a) had the Mw of 79,000, the Mn of 77,000, and the Mw/Mn of 1.03. In addition, as a result of the $^1$H-NMR analysis, the polymer (A-a) was revealed to be a diblock copolymer having the proportions of the structural unit derived from styrene and the structural unit derived from methyl methacrylate were 60.0% by mass (60.0 mol %) and 40.0% by mass (40.0 mol %), respectively.

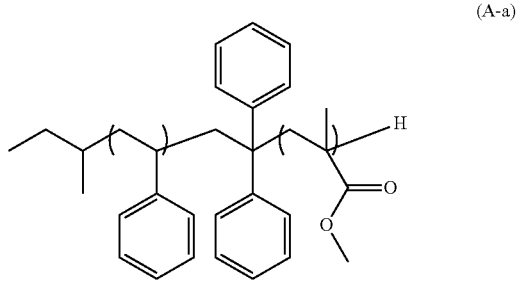

(A-a)

Synthesis Example 2-7: Synthesis of Polymer (A-b)

To a 100 mL three-neck flask equipped with a condenser, a dropping funnel and a thermometer were added 5.23 g of tetramethoxysilane (3.44 mmol), 1.12 g of 3-mercaptopropyltrimethoxysilane (0.57 mmol), 9.69 g of tert-butyl-2-((3-trimethoxysilylpropyl)thio)propionate (2.98 mmol) and 9.20 g of propylene glycol monoethyl ether. While the mixture was stirred at 60° C., 4.33 g of a 10% aqueous oxalic acid solution and 0.43 g of ultrapure water were added dropwise from a dropping funnel over 20 min, followed by heating with stirring for 4 hrs.

The solution of the condensation product thus obtained was concentrated, and thereafter propylene glycol monoethyl ether was added thereto to adjust the solid content concentration to be 30% by mass.

Preparation of Composition (V)

Components other than the polymer (A') used in the preparation of the composition (V) are shown below.

Solvent (S)

S1: Propylene Glycol Monomethyl Ether Acetate

Preparation Example 2-1: Preparation of Composition (S-1)

A composition (S-1) was prepared by mixing 100 parts by mass of (A-1) as the polymer (A'), and 9,900 parts by mass of (S1) as the solvent (S), and then filtering the resultant mixed solution through a membrane filter having a pore size of 200 nm.

Preparation Examples 2-2 to 2-7: Preparation of Compositions (S-2) to (S-6) and (S-a)

Compositions (S-2) to (S-6) and (S-a) were prepared similarly to Preparation Example 2-1 except that each component of the type and the content shown in Table 1 below was used.

TABLE 7

| | Composition (V) | (A') Polymer | | (S) Solvent | | Solid content concentration (% by mass) |
|---|---|---|---|---|---|---|
| | | type | content (parts by mass) | Type | content (parts by mass) | |
| Preparation Example 2-1 | S-1 | A-1 | 100 | Si | 9,900 | 1 |
| Preparation Example 2-2 | S-2 | A-2 | 100 | Si | 9,900 | 1 |
| Preparation Example 2-3 | S-3 | A-3 | 100 | SI | 9,900 | 1 |
| Preparation Example 2-4 | S-4 | A-4 | 100 | Si | 9,900 | 1 |
| Preparation Example 2-5 | S-5 | A-5 | 100 | Si | 9,900 | 1 |
| Preparation Example 2-6 | S-6 | A-4/ A-5 | 80/20 | Si | 9,900 | 1 |
| Preparation Example 2-7 | S-a | A-a | 100 | Si | 16,566 | 0.6 |

Formation of Miniaturized Pattern

Examples 2-1 to 2-6 and Comparative Examples 2-1 and 2-2

An underlayer film having an average thickness of 100 nm was formed on a bare-Si substrate by using a composition for underlayer film formation (JSR Corporation, "HM710"), and on this underlayer film, an SOG film having an average thickness of 30 nm was formed by using an SOG composition (JSR Corporation, "ISX302"). A positive-tone resist composition (JSR Corporation, "AIM5484JN") was applied on the obtained substrate to form a resist film having an average thickness of 85 nm. By carrying out ArF liquid immersion lithography followed by a development with an organic solvent, a resist pattern was formed. Next, by using this resist pattern as a mask, etching of the SOG film was carried out with a gas mixture of $CF_4/O_2$/Air. Then, the underlayer film was etched by using thus obtained SOG film pattern as a mask with an $N_2/O_2$ gas mixture to form a prepattern. A coating film was formed on the prepattern by using the composition (V) shown in Table 8 below among (S-1) to (S-6). Then, baking was carried out under baking conditions involving the temperature and the time period shown in Table 8 below, and the film was rinsed with PGMEA. The denotation "-" of Comparative Example 2-1 in Table 8 indicates that the composition (V) was not applied. Subsequently, a coating film was formed by using (S-a) as the composition (VI), and baked at 220° C. for 20 min. Thereafter, the phase constituted with a PMMA block in the polymer (A-a) was removed with oxygen gas to form a miniaturized pattern.

Evaluation of Substrate-Surface Selectivity of Composition (V)

An underlayer film having an average thickness of 100 nm was formed on a bare-Si substrate by using a composition for underlayer film formation (JSR Corporation, "HM710"), baked at 250° C. for 60 sec, and subsequently baked at 340° C. for 90 sec. The surface layer of the underlayer film was etched with oxygen gas to produce (A) a substrate for evaluation of substrate selectivity. The substrate (A) and the bare-Si substrate (may be referred to as "substrate (B)") was spin-coated with (S-1) to (S-6) as the composition (V) at 1,500 rpm to form a coating film. After baking, and rinsing with PGMEA, contact angles of the coating film with water were measured. The baking conditions and the contact angles are shown together in Table 8 below. It is to be noted that the contact angle indicates: "PS-philic surface" in the case of being no less than 85°; "neutral surface" with respect to the PS block and the PMMA block in the case of being 74° to 78°; and "PMMA-philic surface" in the case of being no greater than 70°. When the surface of the substrate (A) exhibits the PS-philicity or PMMA-philicity, and the surface of the substrate (B) exhibits neutrality, the substrate surface selectivity is evaluated to be favorable. As shown below, any of (S-1) to (S-6) was ascertained to be favorable in the substrate surface selectivity. The contact angle on the substrate (A) is considered to represent the contact angle (θ1) of lateral face sides with water in the recessed portions of the base pattern on the coating film after the heating step. The difference in contact angles between the substrate (A) and the substrate (B) in Comparative Example 2-1 was less than 5°.

TABLE 8

| | Composition (V) | Baking condition (temperature/time period) | Contact angle (°) | |
|---|---|---|---|---|
| | | | substrate (A) | substrate (B) |
| Example 2-1 | S-1 | 150° C./20 min | 86 | 76 |
| Example 2-2 | S-2 | 150° C./20 min | 88 | 78 |
| Example 2-3 | S-3 | 200° C./20 min | 88 | 74 |
| Example 2-4 | S-4 | 150° C./20 min | 90 | 74 |
| Example 2-5 | S-5 | 150° C./20 min | 54 | 76 |
| Example 2-6 | S-6 | 170° C./20 min | 86 | 77 |

TABLE 8-continued

| | Baking condition | Contact angle (°) | |
|---|---|---|---|
| Composition (V) | (temperature/time period) | substrate (A) | substrate (B) |
| Comparative Example 2-1 | — | — | <30 | <30 |
| Comparative Example 2-2 | S-1 | 200° C./20 min | 90 | 90 |

Examples 2-7 and 2-8, and Comparative Examples 2-3 and 2-4

An underlayer film having an average thickness of 100 nm was formed on a bare-Si substrate by using a composition for underlayer film formation (JSR Corporation, "HM710"), and on this underlayer film, an SOG film having an average thickness of 30 nm was formed by using an SOG composition (JSR Corporation, "ISX302"). A positive-tone resist composition (JSR Corporation, "AIM5484JN") was applied on the obtained substrate to form a resist film having an average thickness of 85 nm. By carrying out ArF liquid immersion lithography followed by a development with an organic solvent, a resist pattern was formed. Next, by using this resist pattern as a mask, etching of the SOG film was carried out with a gas mixture of $CF_4/O_2$/Air. Then, the underlayer film was etched by using thus obtained SOG film pattern as a mask with an $N_2/O_2$ gas mixture to form a prepattern. A coating film of (S-1) or (S-5) was formed on the prepattern as the composition (V). Then, baking was carried out under baking conditions shown in Table 9 below, and the film was rinsed with PGMEA. The denotation "-" in Comparative Example 2-4 in Table 9 below indicates that the composition (V) was not applied. Subsequently, a coating film of (S-a) as the composition (VI) was formed, and baked at 220° C. for 20 min. Thereafter, the phase constituted with a PMMA block in the polymer (A-a) was removed with oxygen gas to form a miniaturized pattern.

Evaluation of Uniformity in Coating Film Thickness of Composition (VI)

Uniformity in coating film thickness of the composition (VI) on the prepattern was evaluated with AFM. The results of the evaluation are shown together in Table 9 below. In the case in which the selective modification process using the composition (V) was not employed, an increase in film thickness was topically found due to bimodal distribution of the coating film thickness or formation of an island pattern. On the other hand, in the case in which the selective modification process was employed, formation of the island pattern was not found, and the unimodal dispersion was exhibited, whereby favorable uniformity in coating film thickness was ascertained.

Examples 2-9 and Comparative Examples 2-5

An underlayer film having an average thickness of 100 nm was formed on a bare-Si substrate by using a composition for underlayer film formation (JSR Corporation, "HM710"), and on this underlayer film, an SOG film having an average thickness of 30 nm was formed by using an SOG composition (JSR Corporation, "ISX302"). A positive-tone resist composition (JSR Corporation, "EUVJ2121") was applied on the obtained substrate to form a resist film having an average thickness of 50 nm. By carrying out EUV exposure followed by a development with a 2.38% by mass aqueous tetrabutylammonium hydroxide solution, a resist pattern was formed. Next, by using this resist pattern as a mask, etching of the SOG film was carried out with a gas mixture of $CF_4/O_2$/Air. Then, the underlayer film was etched by using thus obtained SOG film pattern as a mask with an $N_2/O_2$ gas mixture to form a prepattern. A coating film of (S-1) as the composition (V) was formed on the prepattern. Then, baking was carried out under baking conditions shown in Table 10 below, and the film was rinsed with PGMEA. Subsequently, a coating film of (S-a) as the composition (VI) was formed, and baked at 220° C. for 20 min. Thereafter, the phase constituted with a PMMA block in the polymer (A-a) was removed with oxygen gas to form a miniaturized pattern.

Evaluation of Pattern Size Uniformity (CDU)

CDU (nm) was evaluated with SEM on the miniaturized hole pattern formed as described above. The results of the evaluation are shown together in Table 10 below. It is to be noted that the smaller value is considered to indicate more favorable CDU. By employing the selective modification process using the composition (V), improvements of uniformity of pattern size represented by CDU were ascertained.

TABLE 10

| | | Baking condition | CDU (nm) | | | |
|---|---|---|---|---|---|---|
| | Composition (V) | (temperature/time period) | 46 nm CH | 43 nm CH | 41 nm CH | average |
| Example 2-9 | S-1 | 150° C./20 min | 1.9 | 2.1 | 2.1 | 2.9 |
| Comparative Example 2-5 | S-1 | 200° C./20 min | 3.7 | 2.9 | 2.1 | 2.9 |

As is seen from the results shown in Table 10, the pattern-forming method (B) enables a hole pattern superior in pattern size uniformity to be formed by using the composition capable of exhibiting superior substrate-surface selectivity to provide a coating film that is superior in film thickness uniformity.

The pattern-forming method and the composition of the embodiments of the present invention are capable of form-

TABLE 9

| | Composition (V) | Baking condition (temperature/time period) | Film thickness uniformity | | |
|---|---|---|---|---|---|
| | | | 53 nm CH | 56 nm CH | 58 nm CH |
| Example 2-7 | S-1 | 150° C./20 min | unimodal dispersion | unimodal dispersion | unimodal dispersion |
| Example 2-8 | S-5 | 150° C./20 min | unimodal dispersion | unimodal dispersion | unimodal dispersion |
| Comparative Example 2-3 | S-1 | 200° C./20 min | island pattern generation | island pattern generation | island pattern generation |
| Comparative Example 2-4 | — | — | bimodal dispersion | bimodal dispersion | bimodal dispersion | ing a pattern on a substrate with favorable shape and arrangement. Therefore, these can be suitably used for lithography processes in manufacture of various types of electronic devices such as semiconductor devices and liquid crystal devices for which further microfabrication is demanded.

Obviously, numerous modifications and variations of the present invention are possible in light of the above teachings. It is therefore to be understood that within the scope of the appended claims, the invention may be practiced otherwise than as specifically described herein.

What is claimed is:

1. A pattern-forming method comprising:
   forming a base pattern having recessed portions on a front face side of a substrate directly or via other layer;
   filling the recessed portions of the base pattern with a first composition to form a filler layer, the first composition comprising: a first polymer comprising at least two blocks; and a solvent;
   allowing phase separation of the filler layer to form a plurality of phases of the filler layer;
   removing a part of the plurality of phases of the filler layer to form a miniaturized pattern; and
   etching the substrate by directly or indirectly using the miniaturized pattern as a mask,
   wherein the forming of the base pattern comprises:
   forming a resist pattern on the front face side of the substrate;
   forming a layer of a second polymer on lateral faces of the resist pattern; and
   forming a layer of a third polymer that differs from the second polymer on a surface of the substrate or on a surface of the other layer.

2. The pattern-forming method according to claim 1, wherein
   each of the substrate and the other layer comprises on upper faces thereof, at least one of Si—H, Si—OH, Si=O and Si—NR$_2$, wherein each R independently represents a hydrogen atom or a monovalent organic group having 1 to 20 carbon atoms,
   the resist pattern comprises at least one of —COOH and —OH on a lateral face thereof,
   the second polymer comprises a first functional group that bonds to at least one end of a main chain thereof and is capable of forming a chemical bond with at least one of —COOH and —OH, and
   the third polymer comprises a second functional group that bonds to at least one end of a main chain thereof and is capable of forming a chemical bond with at least one of Si—H, Si—OH, Si=O and Si—NR$_2$.

3. The pattern-forming method according to claim 1, wherein the forming of layers of the second polymer comprises: applying a second composition comprising the second polymer and a solvent; and the forming of layers of the third polymer comprises: applying a third composition comprising the third polymer and a solvent.

4. The pattern-forming method according to claim 1, wherein each of the forming of layers of the second polymer and the forming of the third polymer comprises applying a fourth composition comprising the second polymer, the third polymer and a solvent.

5. The pattern-forming method according to claim 3, wherein the forming of the base pattern is carried out in order of: the forming of the resist pattern; the applying of the second composition; and the applying of the third composition.

6. The pattern-forming method according to claim 3, wherein the forming of the base pattern is carried out in order of: the applying of the third composition; the forming of the resist pattern; and the applying of the second composition.

7. The pattern-forming method according to claim 4, wherein the forming of the base pattern comprises:
   the forming of the resist pattern; and
   the applying of the fourth composition after the forming of the resist pattern.

8. The pattern-forming method according to claim 1, wherein the forming of the resist pattern comprises:
   applying a resist composition comprising a polymer comprising an acid-labile group, and radiation-sensitive acid generator;
   exposing the applied resist composition; and
   developing the exposed resist composition with a developer solution comprising an organic solvent.

9. The pattern-forming method according to claim 1, wherein the forming of the resist pattern comprises:
   applying a resist composition comprising a polymer comprising an acid-labile group, and radiation-sensitive acid generator;
   exposing the applied resist composition;
   developing the exposed resist composition with an alkaline developer solution; and
   heating or exposing the developed resist composition.

10. The pattern-forming method according to claim 1, wherein the substrate or the other layer is made from SiO$_2$ or SiN.

11. The pattern-forming method according to claim 1, wherein the other layer is a silicon-containing film.

12. The pattern-forming method according to claim 2, wherein the first functional group is a hydroxyl group, an epoxy group or an oxetanyl group.

13. The pattern-forming method according to claim 2, wherein the second functional group is a carboxy group, a hydroxyl group or a halogen atom.

14. The pattern-forming method according to claim 1, wherein the first polymer is a diblock polymer comprising a polystyrene block and a (meth)acrylic acid ester block.

15. The pattern-forming method according to claim 1, wherein a hole pattern is formed.

16. A pattern-forming method comprising:
    overlaying a base pattern having recessed portions on a front face side of a substrate directly or via other layer;
    applying a fifth composition on lateral faces and bottom faces of the recessed portions of the base pattern to form a coating film;
    heating the coating film;
    filling with a sixth composition, the recessed portions of the base pattern overlaid with the coating film, to form a filler layer;
    allowing phase separation of the filler layer to form a plurality phases of the filler layer;
    removing a part of the plurality phases of the filler layer to form a miniaturized pattern; and
    etching the substrate once or several times using the miniaturized pattern as a mask,
    wherein
    the base pattern comprises as a principal component a polymer comprising aromatic rings, a content of the aromatic rings being no less than 50% by mass with respect to the polymer,
    the fifth composition comprises: a fourth polymer comprising a first structural unit; and a solvent, the sixth composition comprises: a fifth polymer; and a solvent, the fifth polymer comprising a first block comprising a second structural unit, and a second block comprising a third structural unit that is more polar than the second structural unit, and a difference in contact angles ($|\theta 1-\theta 2|$) is no less than 5°, wherein $\theta 1$ is a contact angle of the coating film with water on a lateral face side in the recessed portions and $\theta 2$ is a contact angle of the coating film with water on a bottom face side in the recessed portions, provided that $\theta 1$ and $\theta 2$ are measured after the heating of the coating film.

17. The pattern-forming method according to claim 16, wherein the first structural unit and the second structural unit are both derived from substituted or unsubstituted styrene.

18. The pattern-forming method according to claim 16, wherein in the overlaying, the base pattern is directly overlaid on the front face side of the substrate, and the substrate is made from silicon.

19. The pattern-forming method according to claim 16, wherein a temperature or a time period is controlled in the heating of the coating film.

20. The pattern-forming method according to claim 16, wherein the base pattern is a hole pattern.

\* \* \* \* \*